(12) United States Patent
Kumagai

(10) Patent No.: US 7,777,341 B2
(45) Date of Patent: Aug. 17, 2010

(54) SEMICONDUCTOR DEVICE

(75) Inventor: Hokuto Kumagai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 49 days.

(21) Appl. No.: 12/340,334

(22) Filed: Dec. 19, 2008

(65) Prior Publication Data

US 2010/0127357 A1    May 27, 2010

Related U.S. Application Data

(63) Continuation-in-part of application No. 11/844,928, filed on Aug. 24, 2007, now Pat. No. 7,498,660.

(30) Foreign Application Priority Data

Sep. 15, 2006 (JP) ............................. 2006-251567
Jul. 23, 2007 (JP) ............................. 2007-190873

(51) Int. Cl.
*H01L 29/40* (2006.01)
(52) U.S. Cl. ....................... 257/758; 257/774
(58) Field of Classification Search ................. 257/758, 257/774
See application file for complete search history.

(56) References Cited

U.S. PATENT DOCUMENTS

| 5,891,808 A | 4/1999 | Chang et al. |
| 6,753,608 B2 | 6/2004 | Tomita |
| 7,230,337 B2 | 6/2007 | Usami et al. |
| 7,294,932 B2 | 11/2007 | Hiroi |
| 2004/0084777 A1 | 5/2004 | Yamanoue et al. |
| 2005/0098893 A1 | 5/2005 | Tsutsue et al. |

FOREIGN PATENT DOCUMENTS

| JP | 6-5701 A | 1/1994 |
| JP | 9-306872 A | 11/1997 |
| JP | 2001-23933 A | 1/2001 |
| JP | 2006-5288 A | 1/2006 |

*Primary Examiner*—Douglas M Menz
(74) *Attorney, Agent, or Firm*—Sughrue Mion, PLLC

(57) ABSTRACT

A semiconductor device includes a seal ring formed on an outer circumference of an element forming region when seen from the top in a multilayer interconnect structure formed on a silicon layer, and dummy metal structures formed on a further outer circumference of the seal ring. The more inner circumference side the dummy interconnect is formed on, the more upper layer the dummy interconnect is arranged on.

8 Claims, 31 Drawing Sheets

SEMICONDUCTOR DEVICE

This application is a Continuation in Part of U.S. application Ser. No. 11/844,928, filed Aug. 24, 2007, now U.S. Pat. No. 7,498,660 which claims priority from Japanese patent applications No. 2006-251567 and No. 2007-190873, the contents of which are incorporated hereinto by reference.

BACKGROUND

1. Technical Field

The present invention relates to a semiconductor device.

2. Related Art

In recent years, with an increase in performance of semiconductor devices, insulating film formation technology, so called as a "low dielectric constant insulating film (referred to as low-k film) whose relative dielectric constant is lower than that of SiO$_2$," has been introduced in a semiconductor wafer diffusion process. There are many types of "low-k films", adhesiveness and mechanical strength thereof are generally poor. Therefore, there is a problem in that a crack generated when dicing a wafer reaches a circuit forming region and exerts a harmful influence on the circuit forming region.

Japanese Laid-open Patent Publication No. 2006-5288 discloses a technology for forming a dummy via in each layer on the dicing region side. With this technology, even a crack is generated during dicing, the dummy via can prevent the crack from being propagated to a seal ring.

Japanese Laid-open Patent Publication No. H06-5701 discloses a procedure in which a plurality of grooves are formed on both sides of a scribe line, cutting grooves are formed conforming to the scribe line, and a wafer is divided. In addition, Japanese Laid-open Patent Publication No. H09-306872 discloses a configuration in which a chipping prevention portion composed of double grooves of a first groove and a second groove is provided in a scribe line region formed between a plurality of semiconductor chip regions on a semiconductor wafer.

However, when adhesion strength of the low-k film lowers, the size of chipping fragments increases. When the size of the chipping fragments increases, even the grooves are provided as disclosed in Japanese Laid-open Patent Publication No. H06-5701 and Japanese Laid-open Patent Publication No. H09-306872, the chipping fragments are forced in toward inside of the chip, cross the groove, and come into contact with an inside film of the groove by abrasive water during the dicing. At this time, the chipping fragments are in contact with the inside film while containing high pressure abrasive water and Si fragments during the dicing; and therefore, an inside film of the chip is damaged. If the crack is remained in the inside film of the chip, it becomes a failure in assembling and its assembling yield is lowered.

In addition, as disclosed in Japanese Laid-open Patent Publication No. 2006-5288, if it is configured that the dummy via is formed over the whole layers, there arises a problem in that it is difficult to release crack propagation. A mechanism of this problem will be described below with reference to FIGS. 14 and 15.

In FIG. 14, a semiconductor device 200 has a multilayer structure in which insulating layers laminated in the order of a stopper insulating film 202, a low dielectric constant insulating film 204, and a protective insulating film 206 are laminated in a plural number. In the semiconductor device 200, a dummy via 208 is formed over the whole layers of the multilayer structure.

Impact and crack during the dicing are propagated from the scribe line toward inside of the chip. At this time, generally, as shown in FIG. 14, the impact and crack are propagated as boundary separation 210 between a low dielectric constant insulating film 204 which is weak in adhesion strength and a stopper insulating film 202 located at an under layer of the low dielectric constant insulating film. When the boundary separation 210 is propagated to the dummy via 208, the boundary separation is converted to boundary separation 210' between the dummy via 208 and the low dielectric constant insulating film 204 and impact propagation 212 into the inside of the dummy via 208, as shown in FIG. 15.

At this time, if the dummy via 208 is too long, there is no place where the impact is released; and the impact propagation 212 into the inside of the dummy via 208 is progressed more dominantly than the boundary separation 210'. As a result, as shown in FIG. 16, a metal rupture 214 is generated. Then, as shown in FIG. 17, boundary separation 216 between the low dielectric constant insulating film 204 and the stopper insulating film 202 located at the under layer of the low dielectric constant insulating film is propagated on the inner side of the chip than the dummy via 208. If the boundary separation 216 stops in midstream, the stress is remained; and when assembling is made under this state, the separation is further progressed by thermal stress to lead occurrence of assembling failure.

SUMMARY

In one embodiment, there is provided a semiconductor device including: a semiconductor substrate; a multilayer interconnect structure having a first insulating film and a second insulating film formed in this order on the semiconductor substrate, and interconnects respectively formed in the first insulating film and the second insulating film; a seal ring formed on an outer circumference of an element forming region when seen from the top in the multilayer interconnect structure; a first dummy metal structure formed in the first insulating layer and formed on an outer circumference of the seal ring when seen from the top; a second dummy metal structure formed in the second insulating layer and formed between the first dummy metal structure and the seal ring when seen from the top; wherein the first dummy metal structure and the second dummy metal structure are arranged adjacent to each other and not to overlap when seen from the top, and the upper surface of the first dummy metal structure is arranged at a level equal to or higher than the level of the lower surface of the second dummy metal structure.

The element forming region may have a configuration having a substantially quadrangle shape; and the seal ring may have a configuration surrounding four sides of the element forming region. In addition, the first dummy metal structure and the second dummy metal structure may have a configuration surrounding four sides of an element forming region on the further outer circumference of the seal ring. In the present embodiment, the first dummy metal structure and the second dummy metal structure may respectively have a configuration surrounding four sides of the element forming region. The first dummy metal structure and the second dummy metal structure can be formed in a scribe line region which is formed on the outer circumference than the seal ring located on the semiconductor substrate.

In the present invention, the dummy metal structures can be arranged such that when horizontal stress generated due to impact during dicing is propagated to one of the dummy metal structures, the stress is not directly propagated in the horizontal direction; but, the stress is converted to vertical stress and moved upward along the side surface of the dummy metal structure, and then, angular deformation of the dummy metal structure is generated at the upper surface of the dummy metal structure to generate rupture and boundary separation of the insulating film located at the upper layer. For example, the upper surface of each of the dummy metal structures is arranged at the substantially the same level as the boundary between the insulating films which constitute the multilayer interconnect structure; and accordingly, the stress moved in the vertical direction along the side surface of each of the dummy metal structures can be easily converted to horizontal stress due to the separation or the like between the insulating films. The dummy metal structure may be made up of a dummy interconnect and a slit via. In this case, the dummy metal structure can be arranged such that the upper surface comes in contact with a low dielectric constant film whose relative dielectric constant is not higher than 3.3, for example. Furthermore, the dummy metal structure can be configured such that the upper surface comes in contact with a film with poor adhesiveness against a material which constitutes the dummy metal structure and a film with poor mechanical strength. With this configuration, the separation between the dummy metal structure and the film can be easily generated to be able to easily convert to the horizontal stress. The material which constitutes the dummy metal structure can be, for example, Al, Cu, W, or the like.

Usually, the multilayer interconnect structure includes a local multilayer interconnect layer formed on the semiconductor substrate, a semiglobal interconnect layer formed thereon, and a global interconnect layer formed further thereon. For example, in the case where the local multilayer interconnect layers are of five layers, if the dummy metal structure is continuously formed in the vertical direction over the entire local multilayer interconnect layers, the horizontal stress is not converted to the vertical direction; and there is no place to release crack propagation. Therefore, a disconnection in the dummy metal structure is generated, and an assembly failure is generated due to separation generated during assembling.

According to the embodiments of the present invention, the dummy metal structures are configured that the upper surface of the dummy metal structure formed outside positions the level between the upper surface and the lower surface of the dummy metal structure formed inside or the level hither than the lower surface of the dummy metal structure formed inside, and therefore, even stress due to the dicing and impact due to contact by chipping fragments during the dicing are generated in the horizontal direction of the multilayer interconnect structure, the impact can be converted to the vertical direction toward the upper layer side by angular deformation of the dummy metal structure. Further, the impact can be converted to the horizontal direction again.

In the present invention, the dummy metal structures can be arranged such that the stress is converted to the horizontal direction, the vertical direction, and the horizontal direction again; and finally, the stress is released upward from the uppermost layer of the multilayer interconnect structure. With this configuration, crack generated in the interconnect layer due to the impact is released as chipping; and therefore, it is possible not to remain the crack.

The dummy metal structure can be formed by combination of the interconnect with the slit via. The dummy metal structures can make the interconnects and the vias in the multilayer interconnect structure, and at the same time, the dummy metal structure can be manufactured by a single damascene process or a dual damascene process.

According to the present invention, impact during the dicing can be released to improve yield of the semiconductor device.

BRIEF DESCRIPTION OF THE DRAWING

The above and other objects, advantages and features of the present invention will be more apparent from the following description of certain embodiments taken in conjunction with the accompanying drawings, in which.

DETAILED DESCRIPTION

Figure 1:
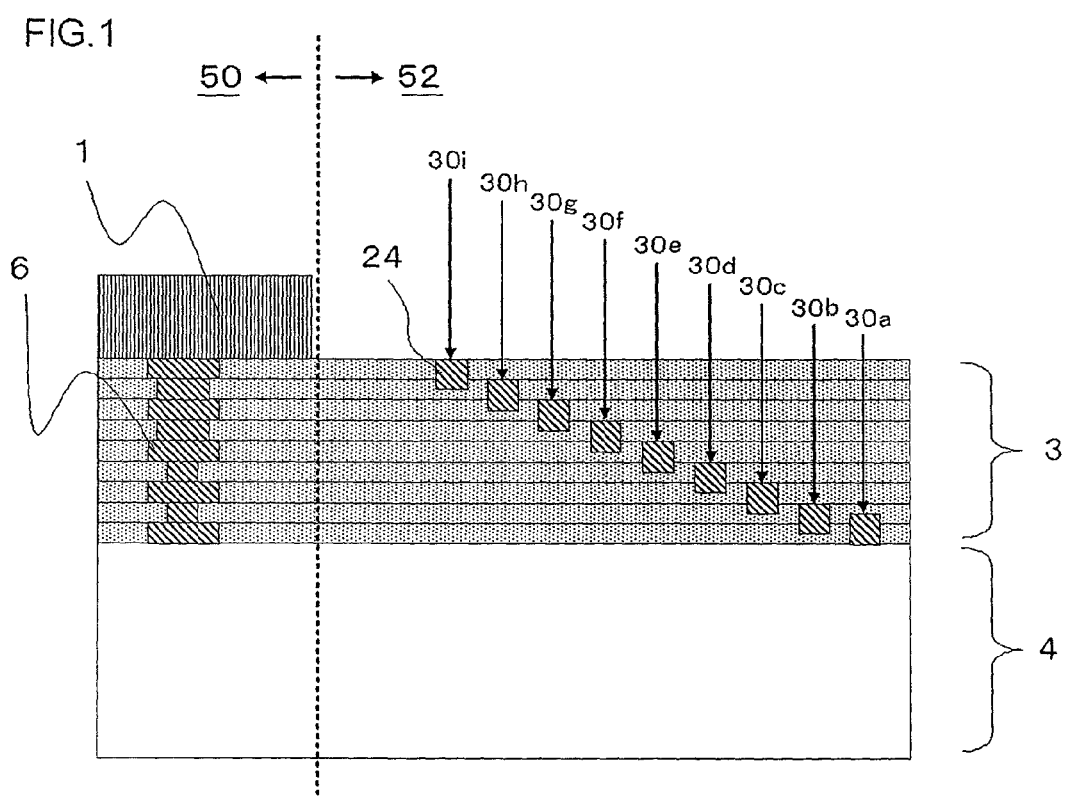
FIG. 1 is a cross-sectional view showing a configuration of a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments according to the present invention will be described below with reference to the drawings. In addition, in all the drawings, the same reference numerals are given to those similar to constitutional elements, and their detail description will not be repeated.

First Embodiment

Figure 2:
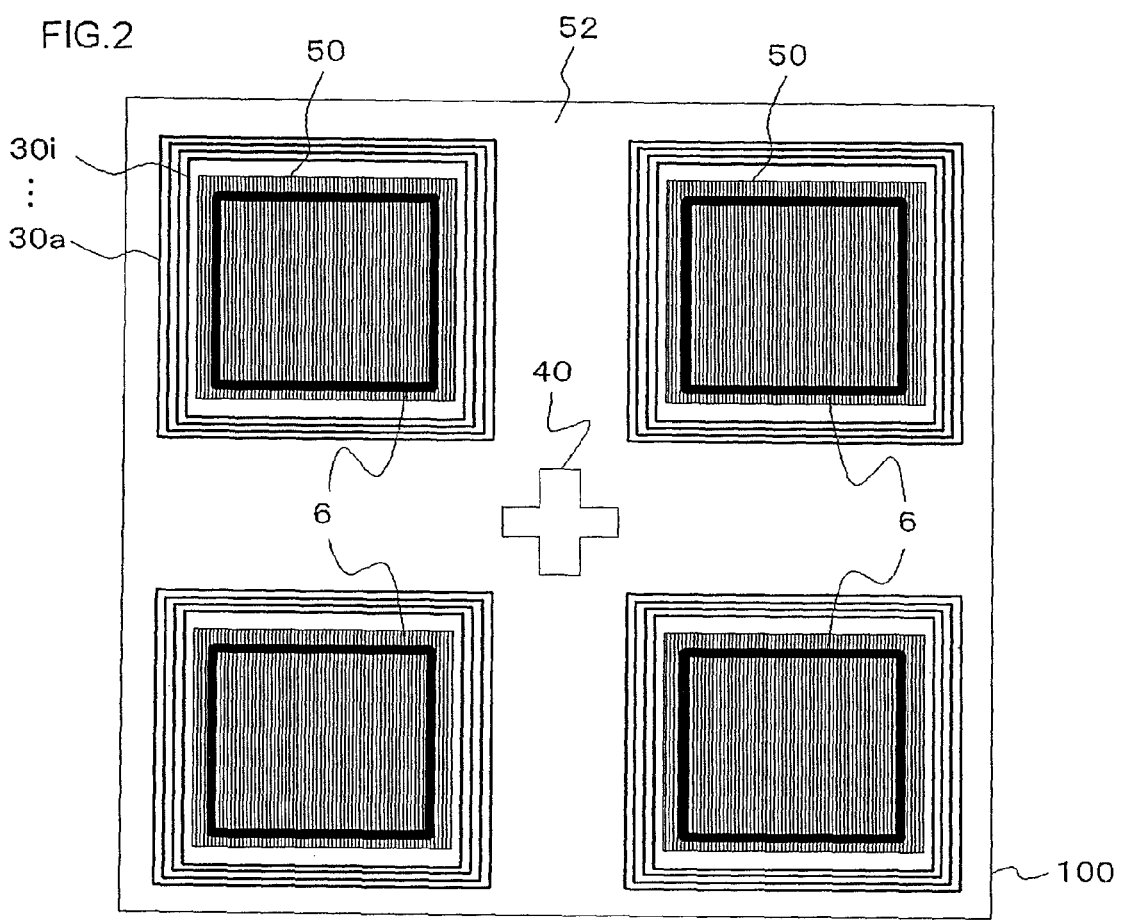
FIG. 2 is a top view showing the configuration of the semiconductor device according to the embodiment of the present invention.

FIG. 1 is a cross-sectional view showing a configuration of a semiconductor device 100 according to a present embodiment; and FIG. 2 is a top view of the semiconductor device 100.

In the present embodiment, the semiconductor device 100 includes a silicon layer 4 (semiconductor substrate) such as a silicon substrate; a multilayer interconnect structure 3, formed on the silicon layer 4, in which an interconnect layer composed of interconnect (not shown in the drawing) and an insulating film are laminated in a plural number; a seal ring 6 formed in the multilayer interconnect structure 3 in an element forming region 50; a first dummy metal structure 30a, a second dummy metal structure 30b, a third dummy metal structure 30c, a fourth dummy metal structure 30d, a fifth dummy metal structure 30e, a sixth dummy metal structure 30f, a seventh dummy metal structure 30g, an eighth dummy metal structure 30h, and a ninth dummy metal structure 30i, those of which are formed in the multilayer interconnect structure 3 in a scribe line region 52; and a polyimide layer 1 formed on the multilayer interconnect structure 3 in the element forming region 50. The first dummy metal structure 30a to the ninth dummy metal structure 30i are arranged in this order from the outer circumference side. That is, the arrangement is made in the order of the ninth dummy metal structure 30i, the eighth dummy metal structure 30h, . . . the second dummy metal structure 30b, and the first dummy metal structure 30a from the element forming region 50 side. In addition, in the present embodiment, the interconnect can be formed by a single damascene process.

In this case, each of the first dummy metal structure 30a to the ninth dummy metal structure 30i is made up of a dummy metal block 24 (the dummy metal block may be made up of a dummy interconnect and a dummy via). In the present embodiment, each of the first dummy metal structure 30a to the ninth dummy metal structure 30i is made up of one dummy metal block 24. The dummy metal block 24 of each dummy metal structure is not continuously arranged in the interconnect layers of not less than a predetermined number of the multilayer interconnect structure 3. In the present embodiment, in each dummy metal structure, the dummy metal block 24 passes through one interconnect layer of the multilayer interconnect structure 3 and is not continuously arranged in the interconnect layers of not less than two layers.

Furthermore, in the present embodiment, as the dummy metal block 24 of the dummy metal structure is arranged nearer to the element forming region 50, the dummy metal block 24 is arranged on the upper layer side of the multilayer interconnect structure 3. For example, in a relationship between the first dummy metal structure 30a and the second dummy metal structure 30b, the lower surface and the upper surface of the dummy metal block 24 of the second dummy metal structure 30b are arranged at the upper level than the lower surface and the upper surface of the dummy metal block 24 of the first dummy metal structure 30a, respectively.

In addition, for example, the dummy metal block 24 of the first dummy metal structure 30a on the outermost circumference located at the farthest from the element forming region 50 is formed in the lowermost layer of the multilayer interconnect structure 3. The lower surface of the dummy metal block 24 of the first dummy metal structure 30a is provided in contact with the silicon layer 4. Next, the dummy metal block 24 of the second dummy metal structure 30b is formed on the upper layer than the dummy metal block 24 of the first dummy metal structure 30a. As described above, in the present embodiment, the dummy metal blocks 24 are arranged in stepwise manner, forming from the lowermost layer to the upper layer as approaching the element forming region 50. In the ninth dummy metal structure 30i on the inner circumference side located closest to the element forming region 50, the upper surface of the dummy metal block 24 is exposed to the upper surface of the multilayer interconnect structure 3. With this configuration, impact during dicing can be released above the multilayer interconnect structure 3.

As shown in FIG. 2, the element forming region 50 has a substantially quadrangle shape. The seal ring 6 is formed on the outer circumference of the element forming region when seen from the top in the multilayer interconnect structure 3. In addition, the first dummy metal structure 30a to the ninth dummy metal structure 30i are formed in this order from outside on the outer circumference of the seal ring 6 when seen from the top in the multilayer interconnect structure 3. That is, the eighth dummy metal structure 30h is formed on the outer circumference of the ninth dummy metal structure 30i; the seventh dummy metal structure 30g is formed on the further outer circumference thereof; and the sixth dummy metal structure 30f to the first dummy metal structure 30a are also formed in the same manner. In this regard, however, in FIG. 2, the dummy metal structures 30a to 30i are omitted, and only for four rows are shown. As described above, the dummy metal structures are arranged to surround the four sides of the element forming region 50; and accordingly, crack progression leakage can be prevented. Furthermore, an alignment mark 40 is arranged between the element forming regions 50.

Next, referring to FIG. 3 to FIG. 9, in the semiconductor device 100 according to the present embodiment, a mechanism in which stress during the dicing is converted will be described.

Figure 3:
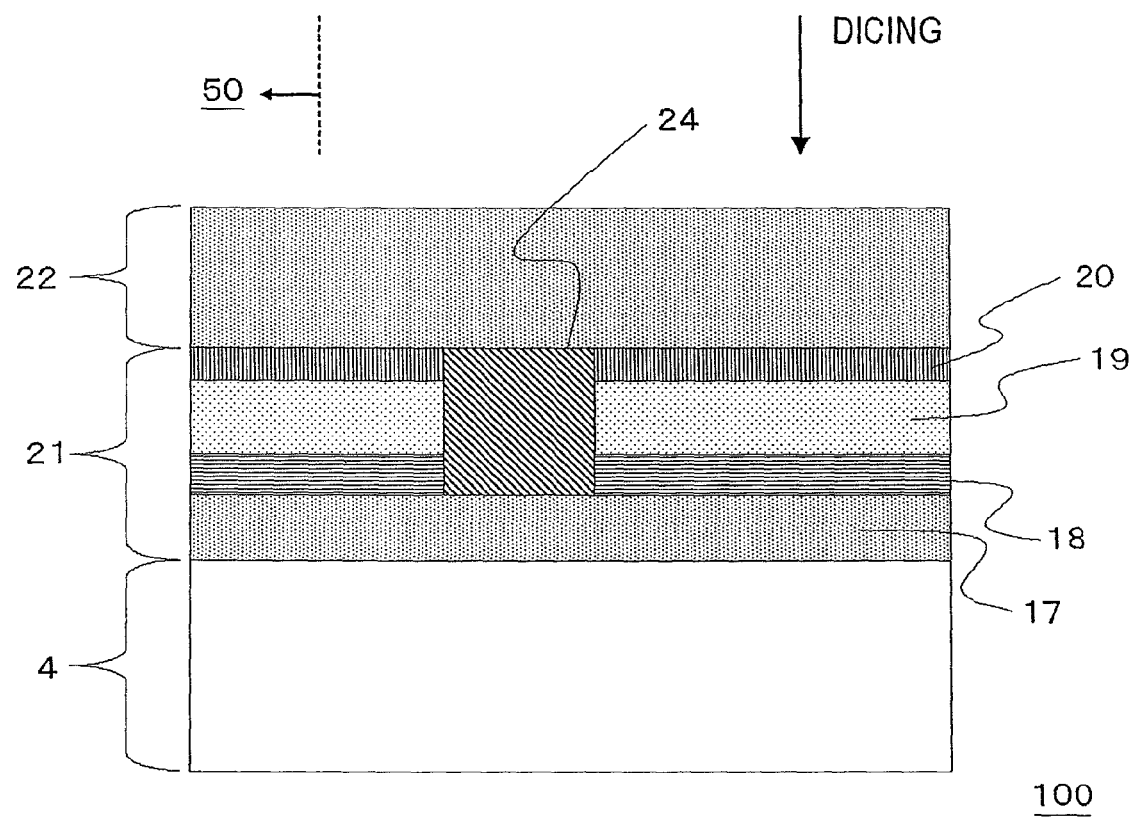
FIG. 3 is a view showing a mechanism in which stress during dicing is converted in the semiconductor device according to the embodiment of the present invention.

In FIG. 3, only one dummy metal block 24 is shown. The multilayer interconnect structure 3 includes a first insulating layer 21, and a second insulating layer 22 formed thereon. The first insulating layer 21 has a configuration laminated in the order of a silicon oxide film 17, a stopper insulating film 18, a low dielectric constant insulating film 19, and a protective insulating film 20. The low dielectric constant insulating film 19 can be an insulating film having a relative dielectric constant film, for example, not higher than 3.3, or preferably, not higher than 2.9.

In the first insulating layer 21, the dummy metal block 24 is formed in the stopper insulating film 18, the low dielectric constant insulating film 19, and the protective insulating film 20. In the present embodiment, the dummy metal block 24 is formed so as to pass through the stopper insulating film 18, the low dielectric constant insulating film 19, and the protective insulating film 20. The upper surface of the dummy metal block 24 positions the same level as the upper surface of the protective insulating film 20, and the lower surface of the dummy metal block 24 positions the same level as the lower surface of the stopper insulating film 18. Not shown in the drawing, but the second insulating layer 22 may have a configuration in which a plurality of films are laminated as in the first insulating layer 21. In this case, the dummy metal block 24 provided in the first insulating layer 21 can be configured to be formed to the midstream of the second insulating layer 22 so that the upper surface of the dummy metal block 24 comes in contact with the lower surface of the low dielectric constant film in the second insulating layer 22. In addition, the first insulating layer 21 and the second insulating layer 22 constitute a local multilayer interconnect layer.

Figure 4:
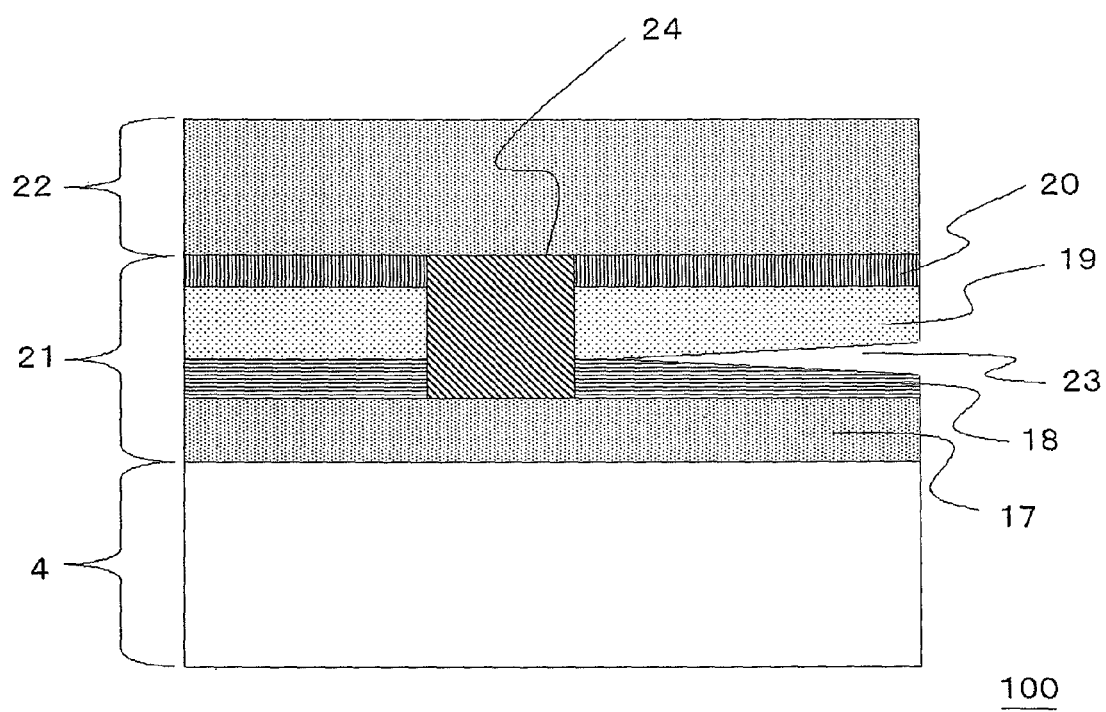
FIG. 4 is a view showing the mechanism in which the stress during the dicing is converted in the semiconductor device according to the embodiment of the present invention.

In the thus configured semiconductor device 100, the case where the dicing is performed along the scribe line is assumed. At this time, there is subject to failure at the lowermost portion of the local multilayer interconnect layer by impact due to the dicing. That is, as shown in FIG. 4, separation 23 is generated at the boundary between the low dielectric constant insulating film 19 and the stopper insulating film 18, and the separation tends to progress toward the element forming region 50 side.

Figure 5:
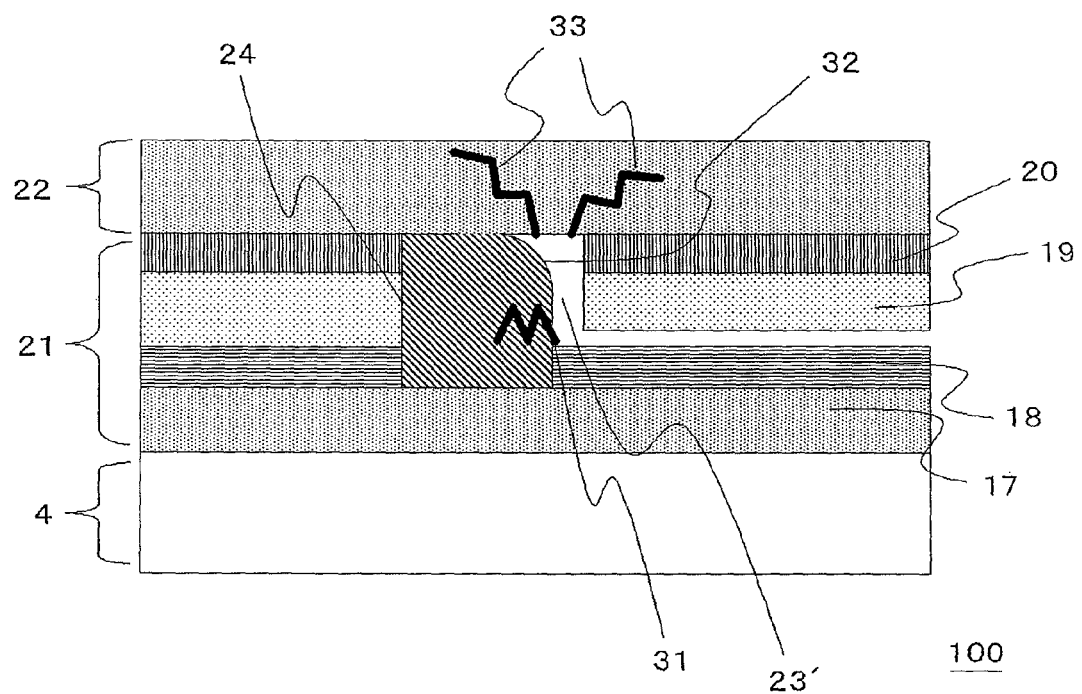
FIG. 5 is a view showing the mechanism in which the stress during the dicing is converted in the semiconductor device according to the embodiment of the present invention.

In the present embodiment, there is arranged the dummy metal block 24 in the first insulating layer 21 in such a manner that the upper surface of the dummy metal block 24 positions at the same level as the upper surface of the protective insulating film 20 and the lower surface of the dummy metal block 24 positions the same level as the lower surface of the stopper insulating film 18. Therefore, when the separation 23 reaches the dummy metal block 24, the separation 23 between the low dielectric constant insulating film 19 and the stopper insulating film 18 is stopped by the dummy metal block 24; and consequently, the impact due to the dicing changes its direction to a vertical direction. Specifically, as shown in FIG. 5, there generate separation 23' between the dummy metal block 24 and the low dielectric constant insulating film 19, stress propagation 31 into the inside of the dummy metal block 24, and angular deformation 32 of the dummy metal block 24. In this case, strong stress propagation 33 is generated in the second insulating layer 22 located at the upper layer by both effects of the separation 23' at the boundary in the vertical direction and the angular deformation 32. As a result, the second insulating layer 22 generates rupture or separation.

Figure 6:
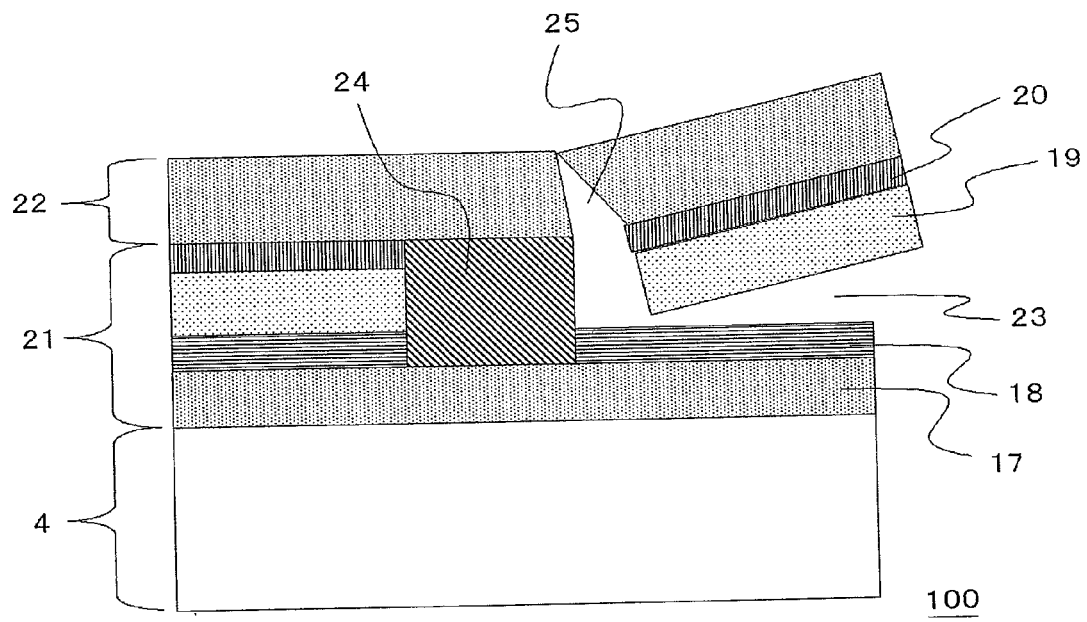
FIG. 6 is a view showing the mechanism in which the stress during the dicing is converted in the semiconductor device according to the embodiment of the present invention.

FIG. 6 is a view showing an example in which rupture 25 is generated in the second insulating layer 22. When the rupture 25 reaches the surface side of the semiconductor device 100, chipping is generated.

Figure 7:
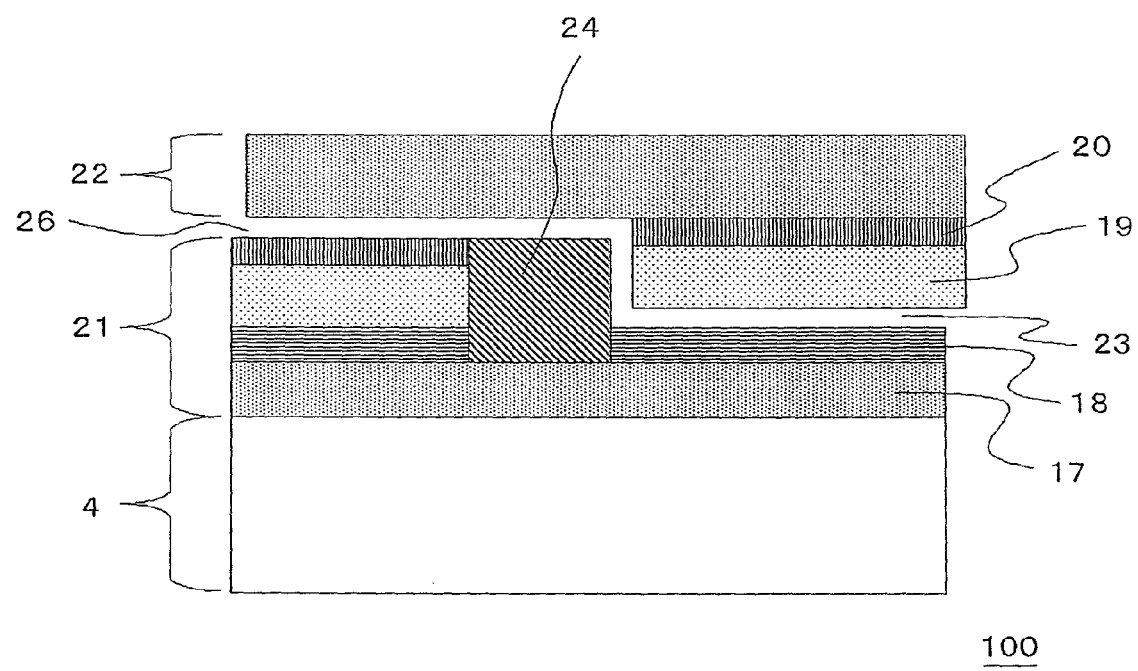
FIG. 7 is a view showing the mechanism in which the stress during the dicing is converted in the semiconductor device according to the embodiment of the present invention.
Figure 8:
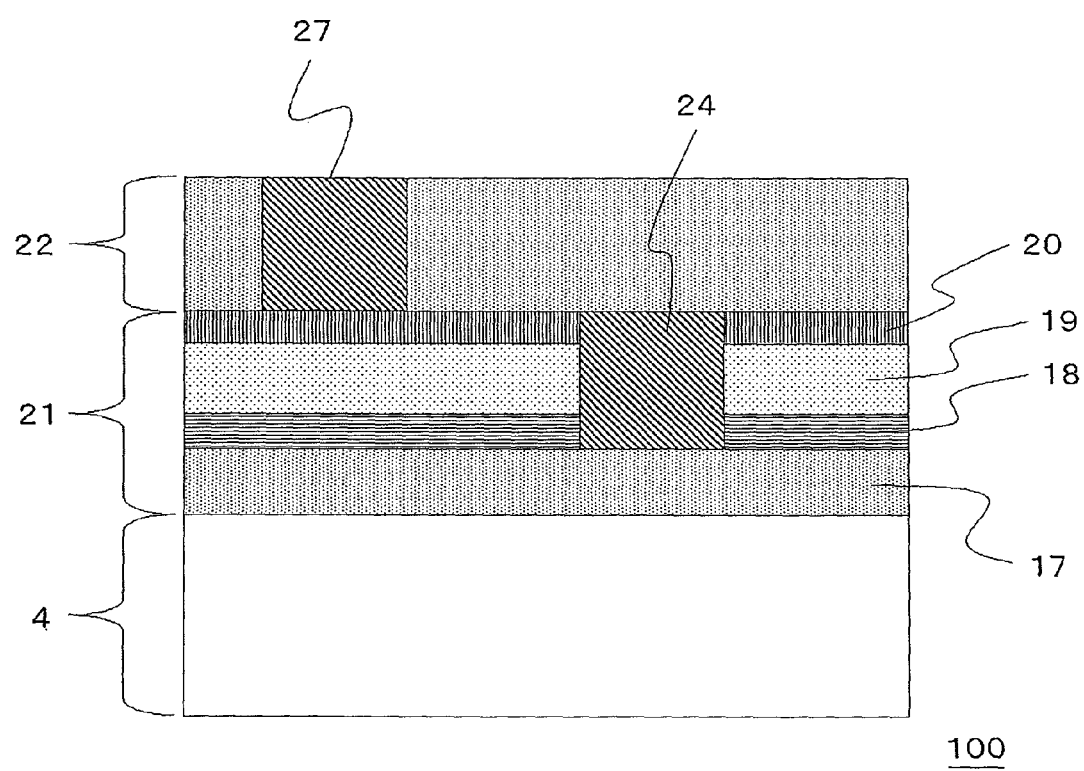
FIG. 8 is a view showing the mechanism in which the stress during the dicing is converted in the semiconductor device according to the embodiment of the present invention.
Figure 9:
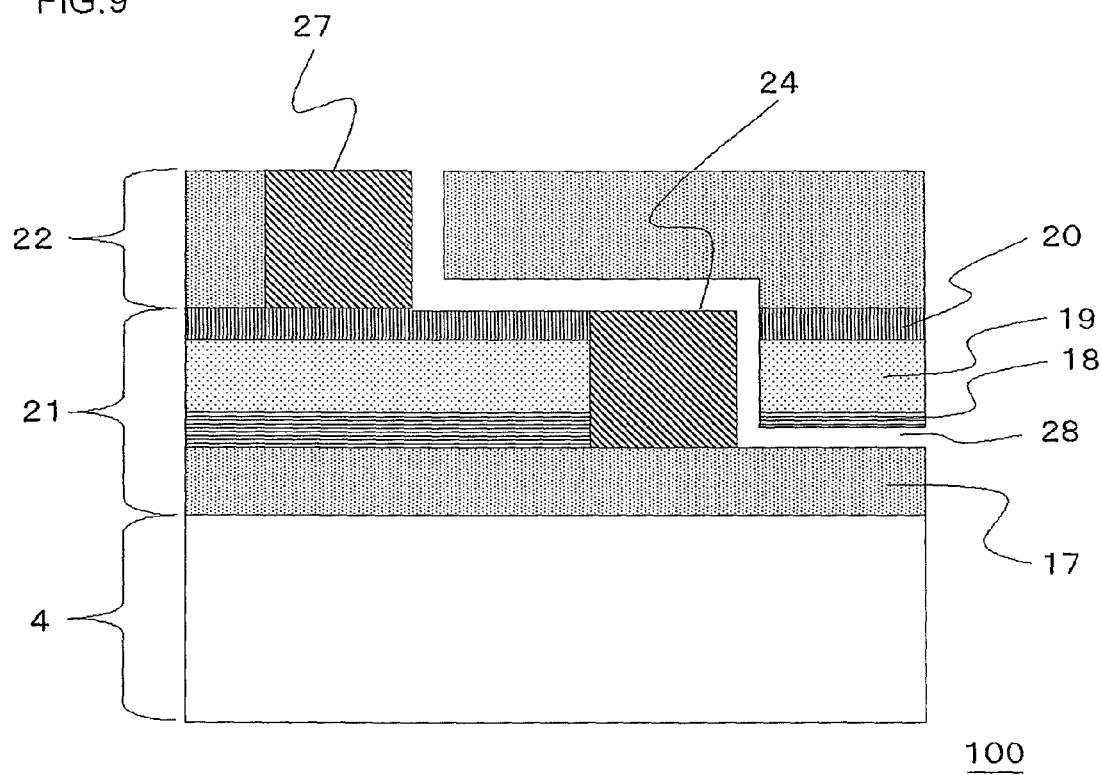
FIG. 9 is a view showing the mechanism in which the stress during the dicing is converted in the semiconductor device according to the embodiment of the present invention.

FIG. 7 is a view showing an example in which separation 26 is generated at the boundary between the second insulating layer 22 and the first insulating layer 21 over the upper surface of the dummy metal block 24. In this case, the separation 26 further progresses horizontally. As shown in FIG. 8, a dummy metal block 27 is also provided in the second insulating layer 22; and accordingly, the separation 26 between the first insulating layer 21 and the second insulating layer 22 is stopped by the dummy metal block 27 in the second insulating layer 22 and stress can be directed toward the vertical direction, as described above regarding the dummy metal block 24 provided in the first insulating layer 21. With this configuration, the second insulating layer 22 and the dummy metal block 27 is separated, and separation 28 is generated as shown in FIG. 9.

In addition, the first insulating layer 21 and the second insulating layer 22 may be a single layer structure or a laminated layer structure, respectively. For example, the second insulating layer 22 may include the stopper insulating film 18 and the protective insulating film 20 as in the first insulating layer 21. Further, FIG. 3 or the like shows a configuration in which the first insulating film 21 includes a silicon oxide film 17; however, the first insulating layer 21 may have a configuration which does not include the silicon oxide film 17.

Referring back to FIG. 1, the dummy metal blocks 24 are repeatedly arranged in stepwise manner so as to be upper layers as the dummy metal blocks 24 approach the element forming region 50 in a direction from outer circumference side to the element forming region 50, from the lowermost layer to the upper surface of the multilayer interconnect structure 3; and accordingly, crack can be prevented from progressing even the separation is generated in any interconnect layer during the dicing. In addition, the upper surface of the dummy metal block 24 of the ninth dummy metal structure 30i is arranged at not lower than the same level as the upper surface of the uppermost layer of the multilayer interconnect structure 3; and accordingly, the crack can be released outside the multilayer interconnect structure 3. Furthermore, with this configuration, impact due to the dicing can be finally released upward as chipping.

Further, the dummy metal blocks 24 of adjacent dummy metal structures can be arranged so that heightwise positions are overlapped with each other. That is, for example, the lower surface of the dummy metal block 24 of the ninth dummy metal structure 30i can be arranged below the level of the upper surface of the dummy metal block 24 of the eighth dummy metal structure 30h. As described above, an overlap region is provided in the dummy metal blocks 24 in the adjacent rows; and accordingly, horizontal stress can be easily converted to vertical stress at the boundary of the dummy metal block 24.

In addition, in the semiconductor device 100 according to the present embodiment, it is possible to use with concomitant use of a configuration provided with a groove for chipping prevention in the scribe line region 52 as disclosed in Japanese Laid-open Patent Publication No. H06-5701 and Japanese Laid-open Patent Publication No. H09-306872, for example. In this configuration, dummy metal structure groups can be arranged on outer circumference, inner circumference, or both circumferences of the grooves for chipping prevention. Specific examples will be described below.

Figure 10:
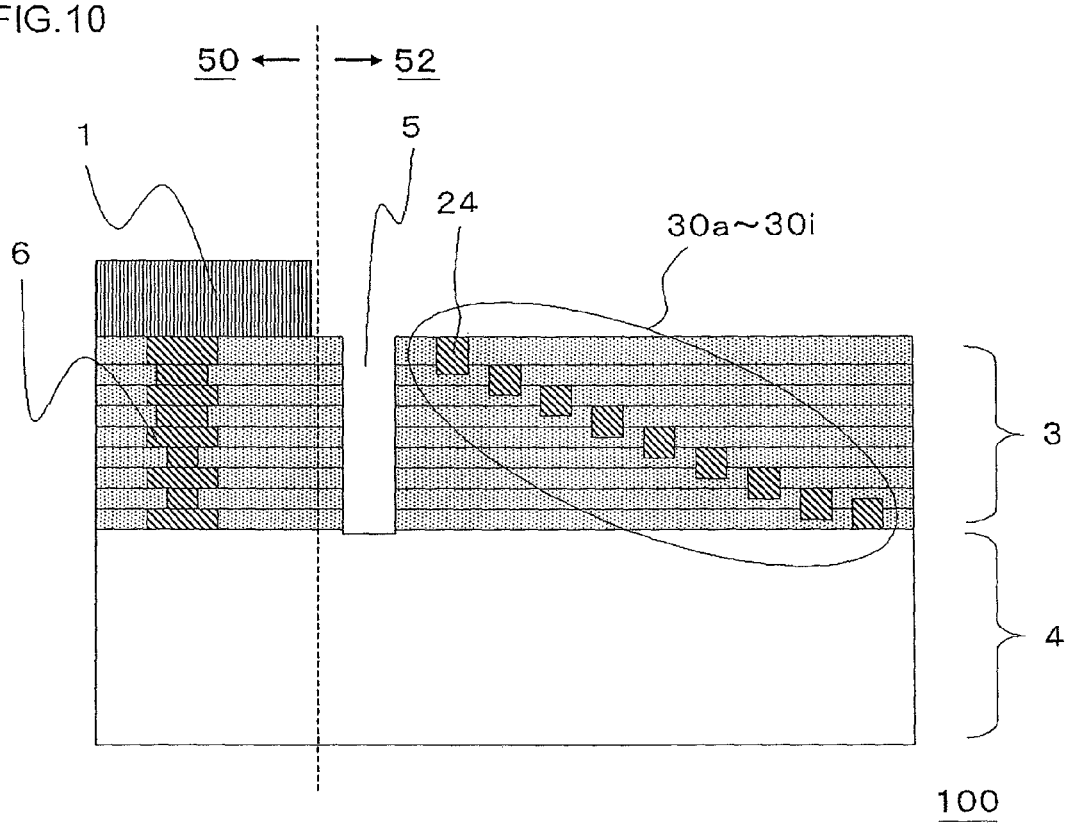
FIG. 10 is a cross-sectional view showing another example of a semiconductor device according to an embodiment of the present invention.
Figure 11:
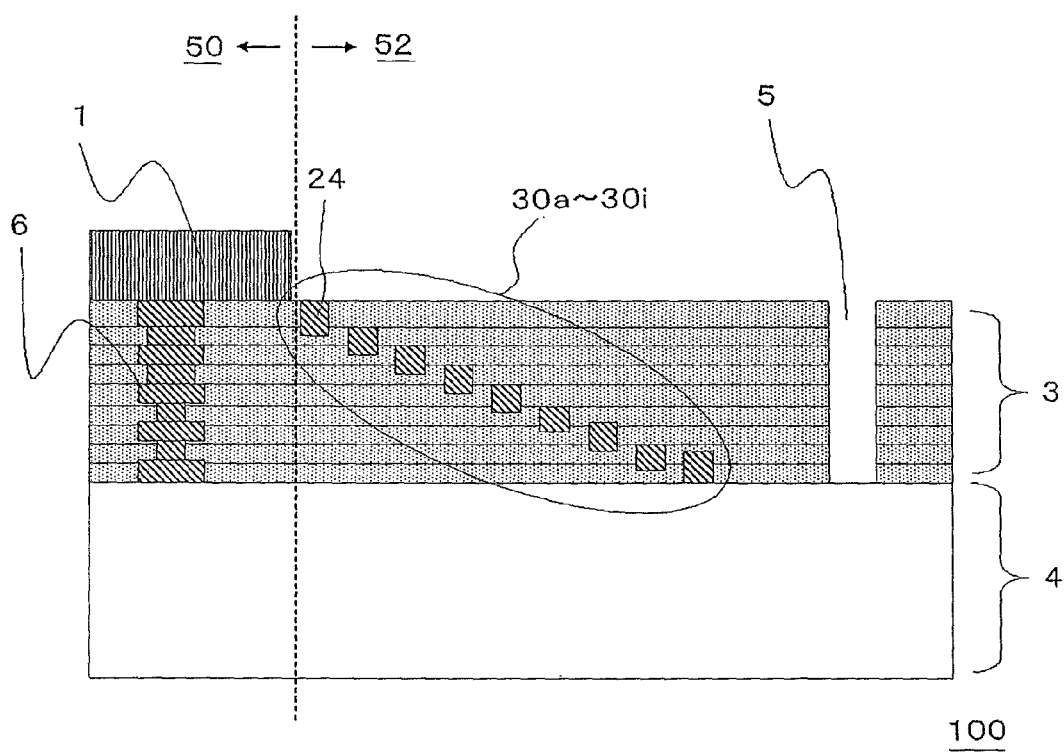
FIG. 11 is a cross-sectional view showing another example of the semiconductor device according to the embodiment of the present invention.

FIG. 10 shows a configuration in which a groove 5 is provided between a group of dummy metal structures (a first dummy metal structure 30a to a ninth dummy metal structure 30i) and a seal ring 6 in a scribe line region 52. FIG. 11 shows a configuration in which the groove 5 is provided on the further circumference of the group of dummy metal structures (the first dummy metal structure 30a to the ninth dummy metal structure 30i) in the scribe line region 52.

Figure 12:
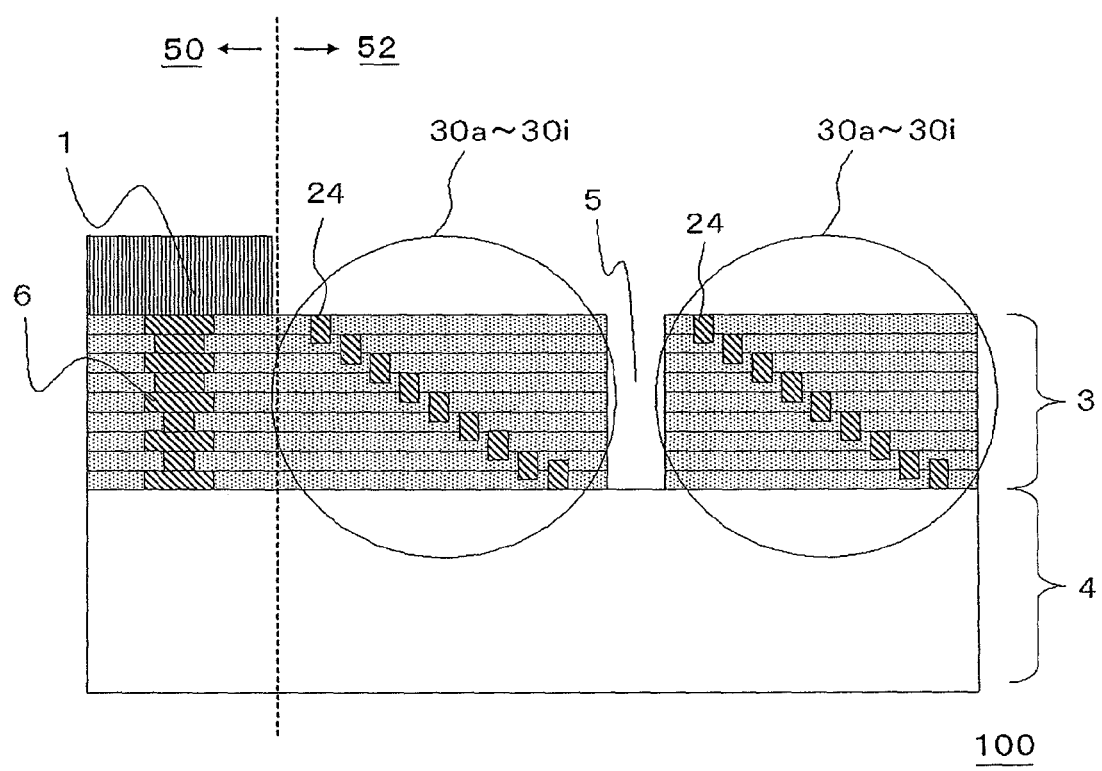
FIG. 12 is a cross-sectional view showing another example of the semiconductor device according to the embodiment of the present invention.

In addition, in the present embodiment, the semiconductor device 100 can have a configuration including a plurality of groups each including a stepwise dummy metal structures (the first dummy metal structure 30a to the ninth dummy metal structure 30i). FIG. 12 shows a configuration in which the groove 5 is provided between the plurality of groups of the dummy metal structures.

As described above, according to the semiconductor device 100 of the present embodiment, a wafer of advanced process generation including a low dielectric constant film with poor mechanical strength and poor adhesiveness can be diced without film separation failure. In addition, the configuration is made such that a minute crack remained during the dicing is not progressed into a circuit; and therefore, reliability after packaging can be secured.

Second Embodiment

Figure 13:
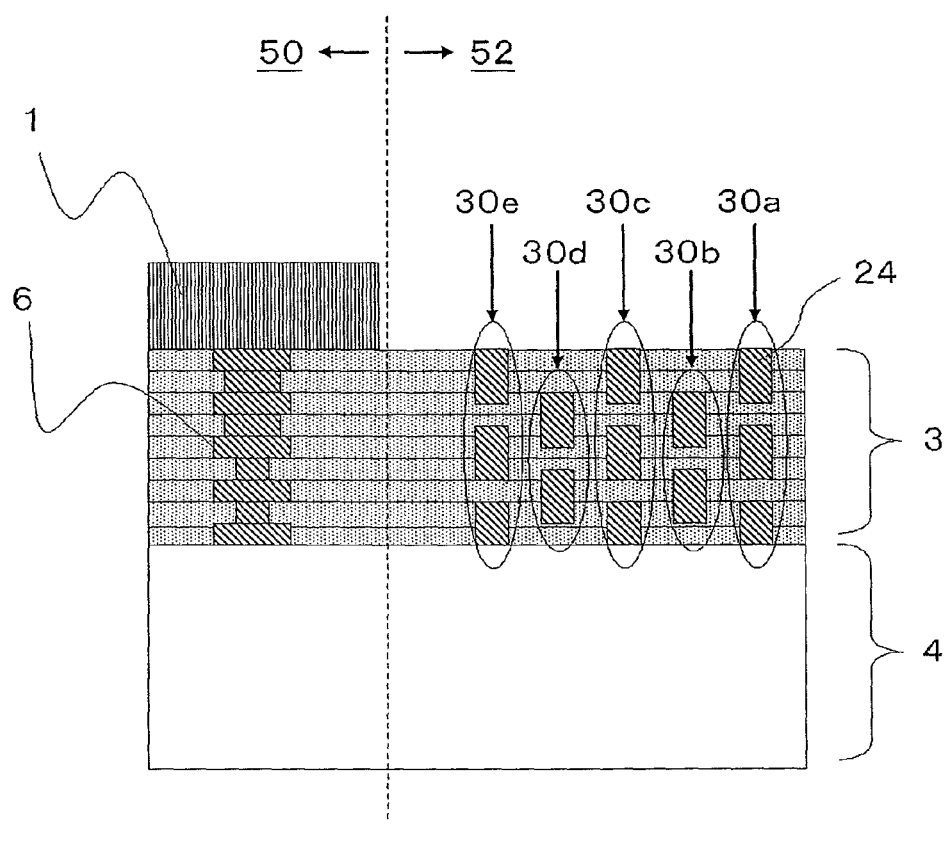
FIG. 13 is a cross-sectional view showing a configuration of a semiconductor device according to an embodiment of the present invention.
Figure 14:
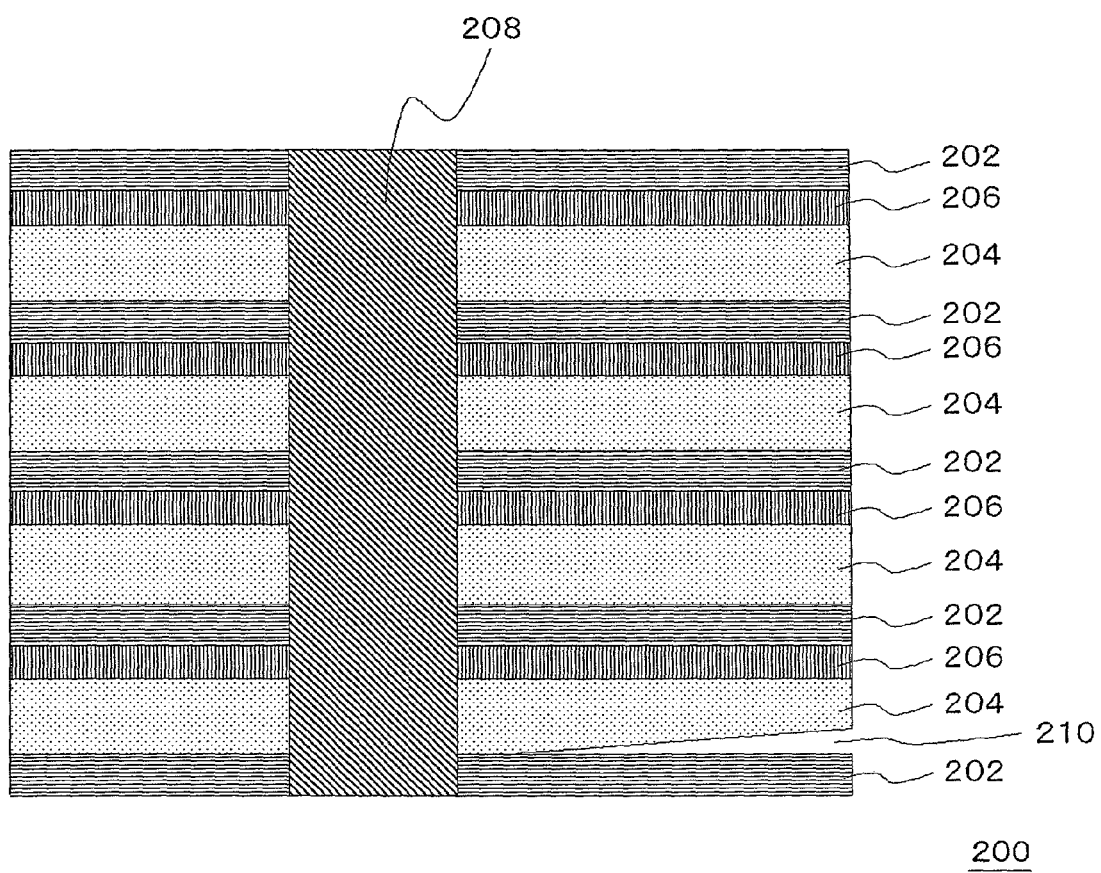
FIG. 14 is a cross-sectional view for explaining a problem of a conventional semiconductor device.
Figure 15:
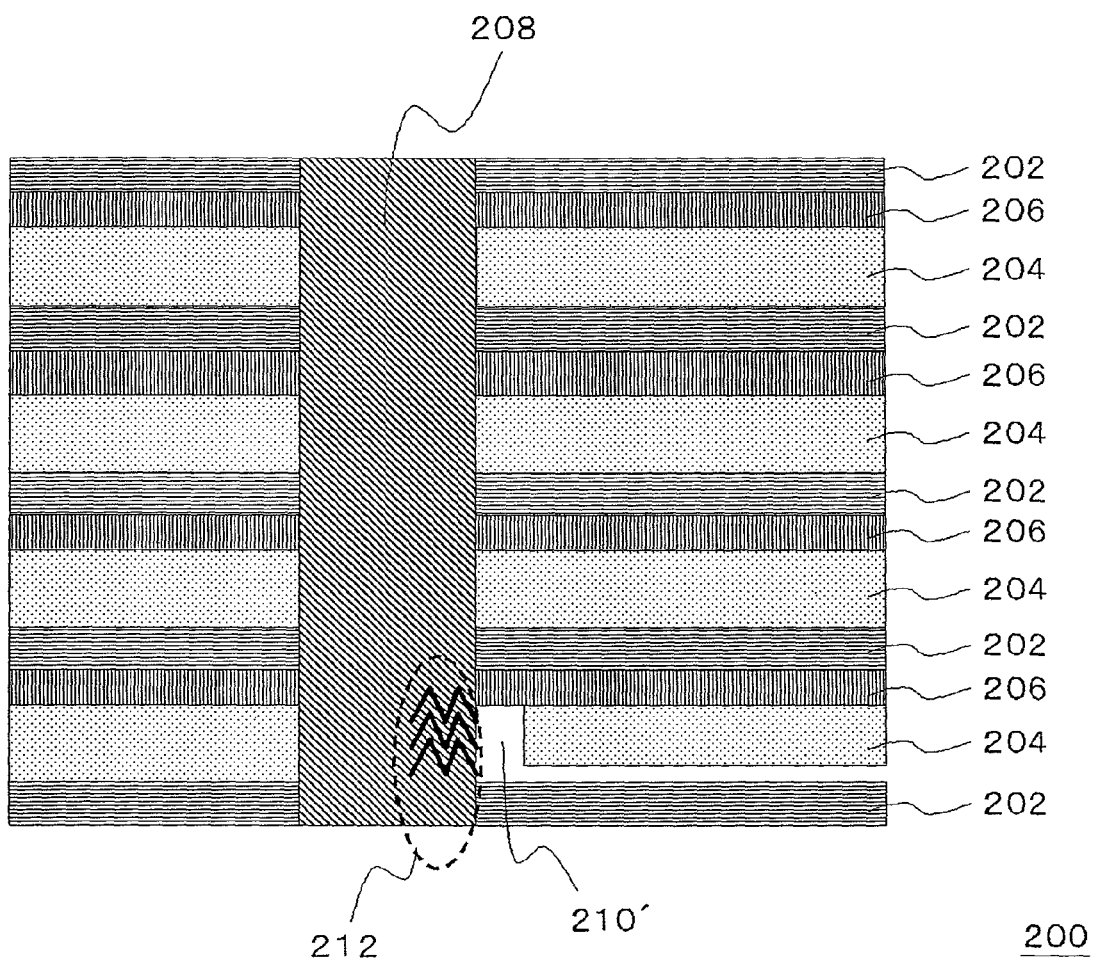
FIG. 15 is a cross-sectional view for explaining the problem of the conventional semiconductor device.
Figure 16:
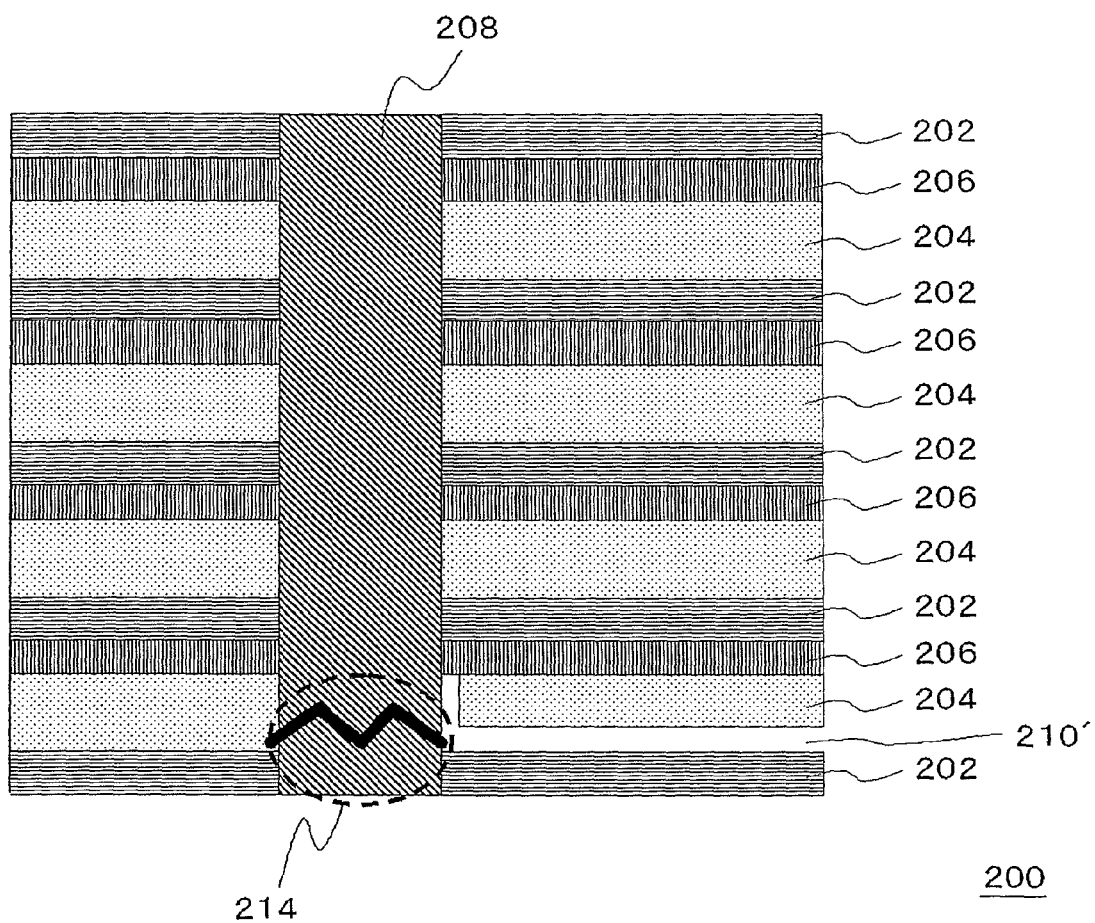
FIG. 16 is a cross-sectional view for explaining the problem of the conventional semiconductor device.
Figure 17:
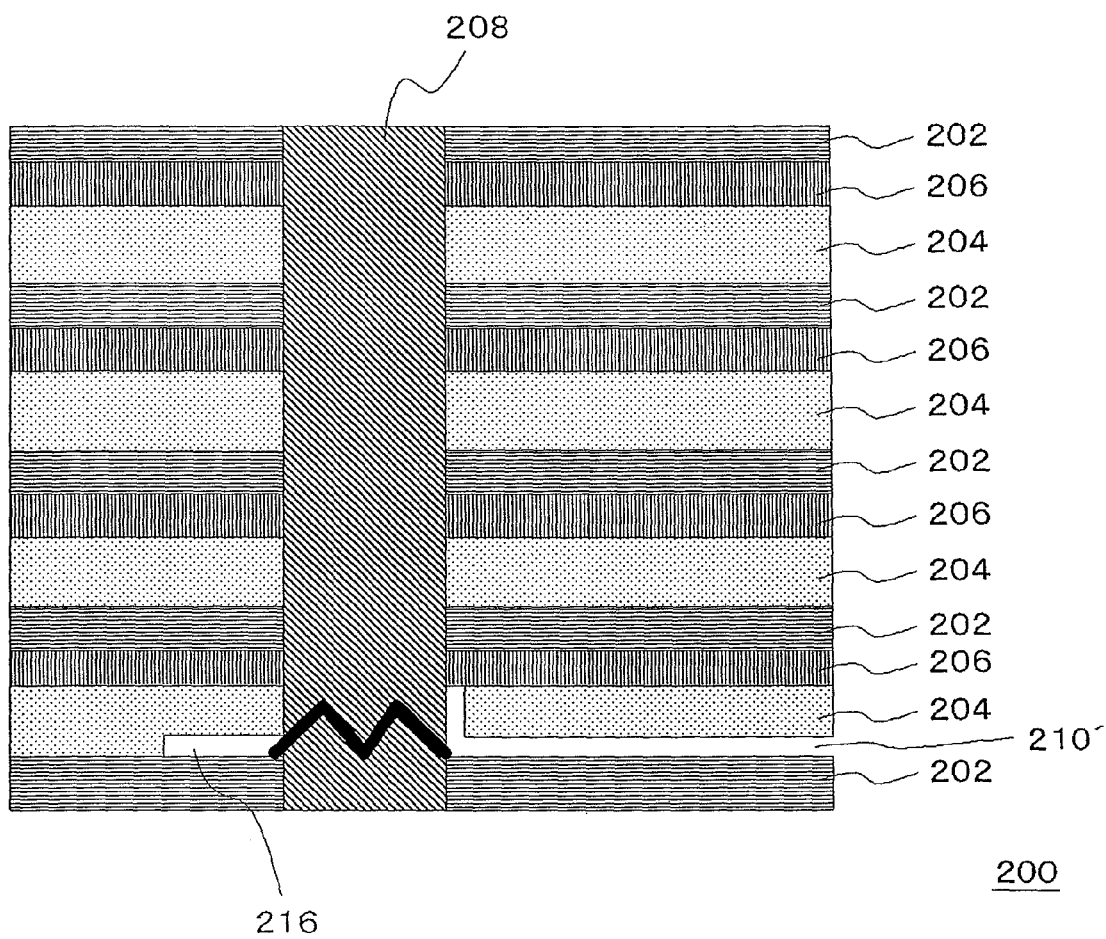
FIG. 17 is a cross-sectional view for explaining the problem of the conventional semiconductor device.

FIG. 13 is a cross-sectional view showing a configuration of a semiconductor device 100 according to a present embodiment.

In the present embodiment, the semiconductor device 100 includes a first dummy metal structure 30a, a second dummy metal structure 30b, a third dummy metal structure 30c, a fourth dummy metal structure 30d, and a fifth dummy metal structure 30e. The present embodiment may also further include a large number of dummy metal structures as in the first embodiment.

In the present embodiment, each of the first dummy metal structure 30a to the fifth dummy metal structure 30e is made up of a plurality of dummy metal blocks 24, respectively. In the present embodiment, the dummy metal blocks 24 continuously arranged at the same position in a laminating direction are put together, and they are called as one "dummy metal structure."

Each of the dummy metal structures has an arrangement where a region formed with the dummy metal block 24 and a region without the dummy metal block 24 are alternately provided in a laminated direction of the multilayer interconnect structure 3. In addition, in one dummy metal structure, the dummy metal block 24 is formed in a region at the same level as a region where the dummy metal block 24 is not formed in an adjacent other dummy metal structure. For example, a relationship between the first dummy metal structure 30a and the second dummy metal structure 30b is as follows. In the second dummy metal structure 30b, the dummy metal block 24 is formed in a region at the same level as a region where the dummy metal block 24 is not formed in the first dummy metal structure 30a. Furthermore, in the first dummy metal structure 30a, the dummy metal block 24 is formed in a region at the same level as a region where the dummy metal block 24 is not formed in the second dummy metal structure 30b. That is, the semiconductor device 100 can be configured that the dummy metal blocks 24 are formed in a diagonal lattice shape such as staggered lattice shape or the like in the cross-sectional view of the multilayer interconnect structure 3. In addition, as described in the first embodiment, an overlap region can be provided in the dummy metal blocks 24 in the adjacent rows; and accordingly, horizontal stress can be easily converted to vertical stress at the boundary of the dummy metal block 24.

In also the present embodiment, similar merits as in the first embodiment can be obtained. Further, even in the case where the width of scribe line in the semiconductor device 100 is narrow, the dummy metal blocks 24 can be efficiently arranged. Particularly, the configuration of the present embodiment can be used in the case where an insulating film which is subject to separation is located at the upper layer of the multilayer interconnect structure 3, and in the case where an impact direction can be changed even when the height of the dummy metal block 24 is approximately for two layers.

Third Embodiment

Figure 18:
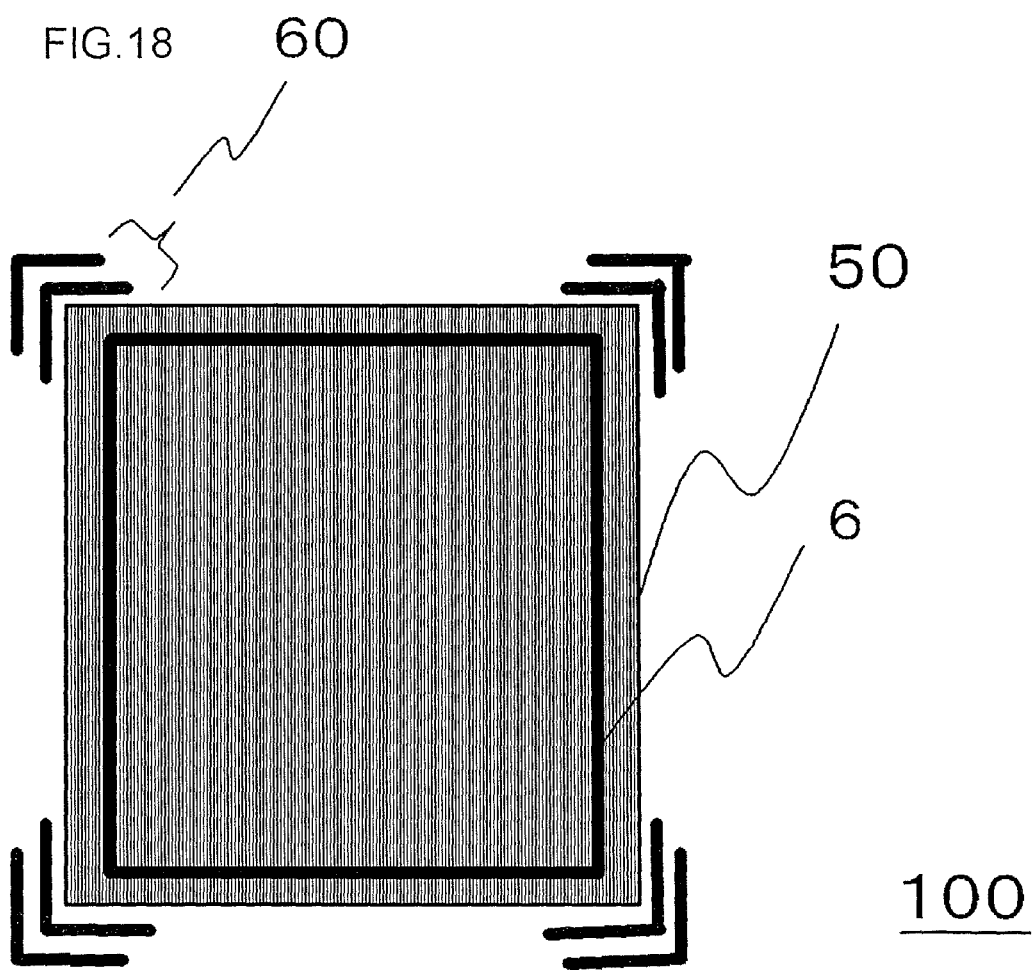
FIG. 18 is a plan view showing a configuration of a semiconductor device according to an embodiment of the present invention.

FIG. 18 is a plan view showing a configuration of a semiconductor device 100 according to a present embodiment.

The present embodiment is different from other embodiment in that the groups of the dummy metal structures 60 (dummy metal groups) are arranged only in the vicinities of the corners of an element forming region 50.

Figure 19:
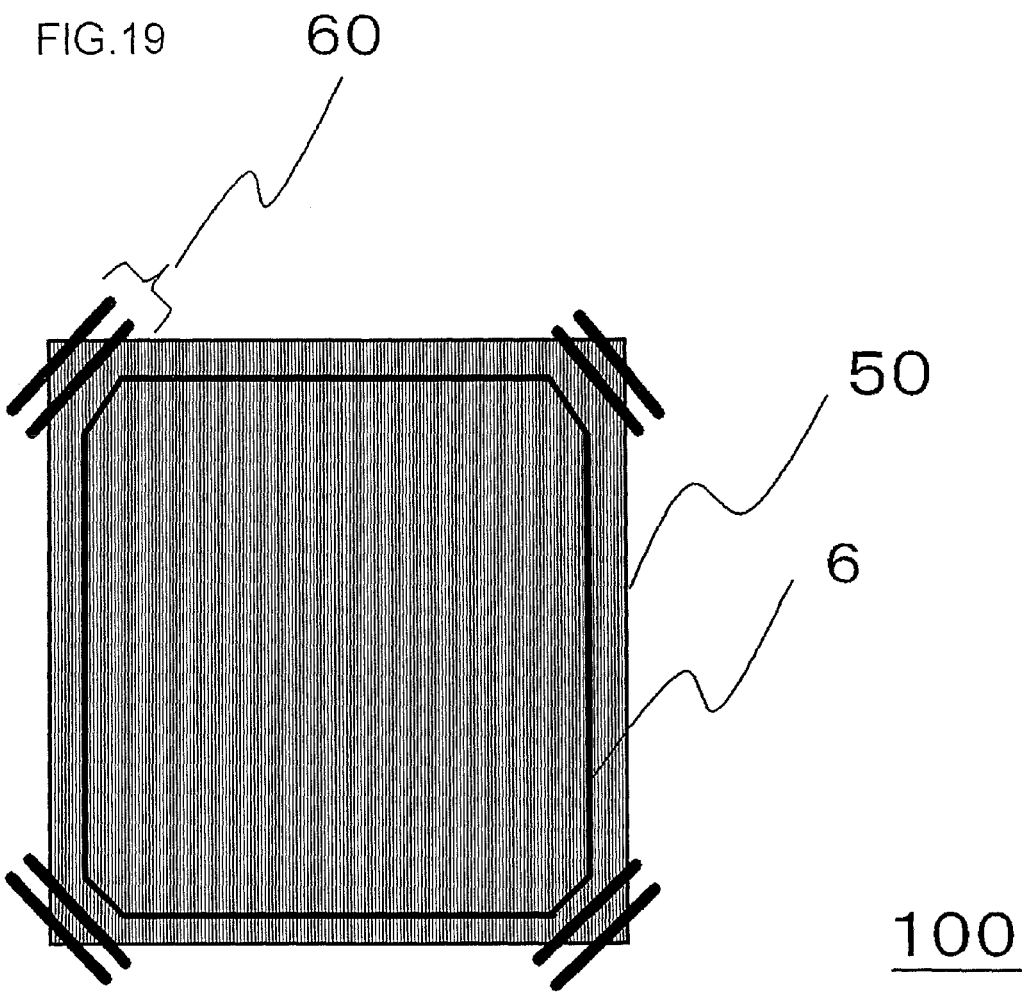
FIG. 19 is a plan view showing the configuration of the semiconductor device according to the embodiment of the present invention.

As shown in FIG. 18, the groups of the dummy metal structures 60 can be formed, for example, in an L shape at the corner of the element forming region. Any shapes may be used if it covers the corners, thus the shape is not limited to the L shape. For example, as shown in FIG. 19, the shape may be linear, or semicircular. The group of the dummy metal structures 60 includes at least a first dummy metal structure and a second dummy metal structure. In addition, any configuration described in this specification may be used in the group of the dummy metal structures 60 mentioned in this case.

Stress during dicing is particularly concentrated at the corners of the element forming region; and therefore, in the present configuration, stress propagation from the corners can be released in a vertical direction. Consequently, separation or the like in the element forming region can be prevented.

Further, generally, an accessory pattern such as an alignment mark or a superposition mark is arranged in a scribe line region (not shown in the drawing). In the present configuration, the groups of the dummy metal structures 60 are arranged only in the vicinities of the corners of the element forming region 50; and therefore, a degree of freedom in accessory pattern arrangements can be improved.

In addition, since the stress is concentrated at the corners of the element forming region, elements are not formed in such regions; and therefore, as shown in FIG. 19, there is a case that a seal ring 6 is formed on the inside of the corners of the element forming region 50. In this case, the groups of the dummy metal structures 60 can be formed on the outside of the seal ring 6 and, for example, in oblique directions and linearly with respect to the sides of the element forming region 50. In the drawing, portions of the group of the dummy metal structures 60 are formed across the inside of the element forming region 50; however, the portions may be formed on the outside of the element forming region 50.

Fourth Embodiment

Figure 20:
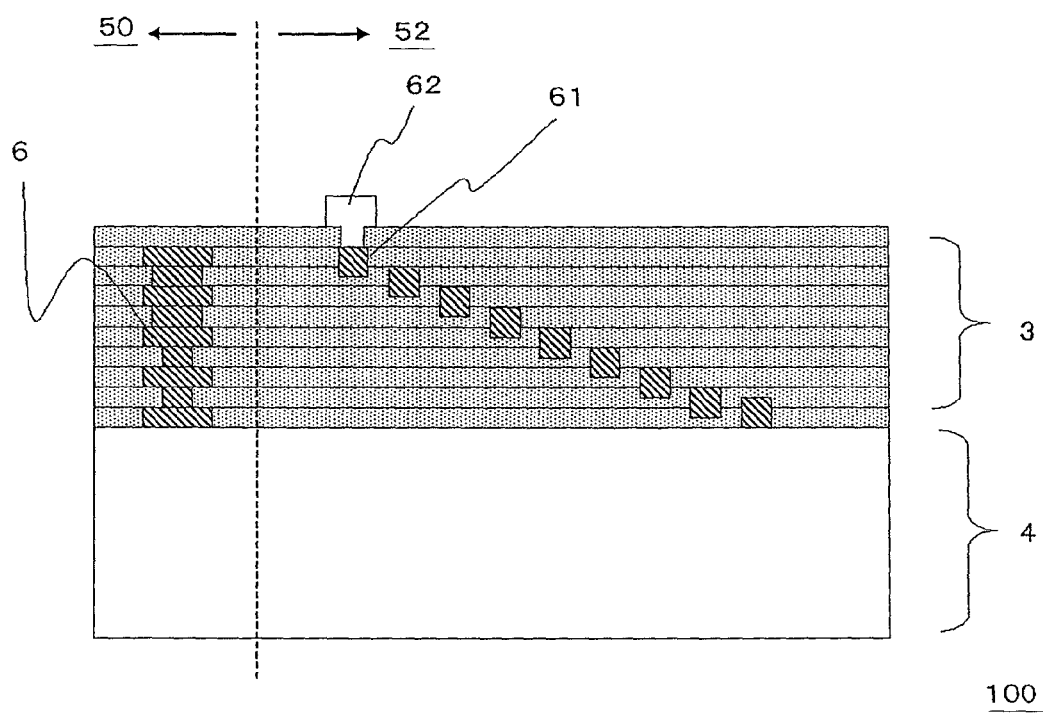
FIG. 20 is a cross-sectional view showing a configuration of a semiconductor device according to an embodiment of the present invention.

FIG. 20 is a cross-sectional view showing a configuration of a semiconductor device 100 according to a present embodiment.

The present embodiment is different from other embodiment in that a structure 62 composed of a metal material is formed on a dummy metal 61 located at an uppermost layer. The metal material of the structure 62 has lower hardness or coefficient of elasticity than that of the dummy metal. In the drawing, description of a surface protective film (polyimide film or the like) is not shown.

If a material which constitutes a dummy metal such as the dummy metal 61 is Cu, for example, Al can be used as the structure 62 formed thereon. The structure 62 can be composed of the same material as a pad electrode (not shown in the drawing) of an element forming region 50, and the structure 62 can be formed with the pad electrode at the same time.

In addition, a dummy metal structure shown in FIG. 20 is exemplification; and any configuration described in this specification may be used.

According to the semiconductor device 100 of the present embodiment, the structure formed of the metal material with low hardness and coefficient of elasticity, that is, a deformable metal material is formed on the uppermost layer dummy metal 61; and therefore, stress generated during dicing is more efficiently propagated in a vertical direction.

Fifth Embodiment

Figure 21A:
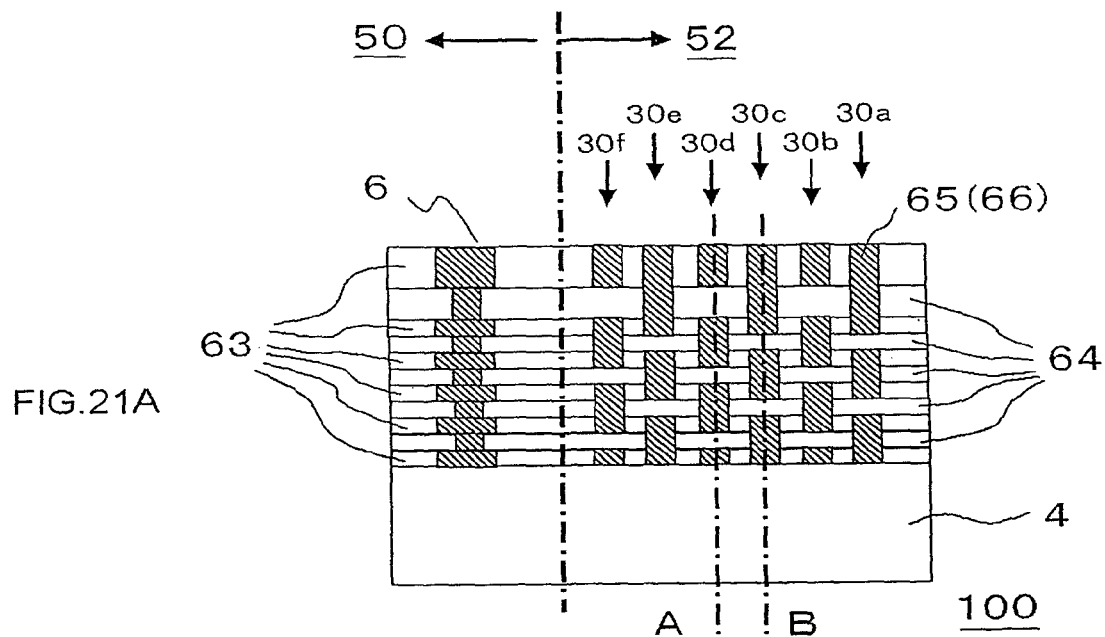
FIGS. 21A to 21C are cross-sectional views each showing a configuration of a semiconductor device according to an embodiment of the present invention.
Figure 21B:
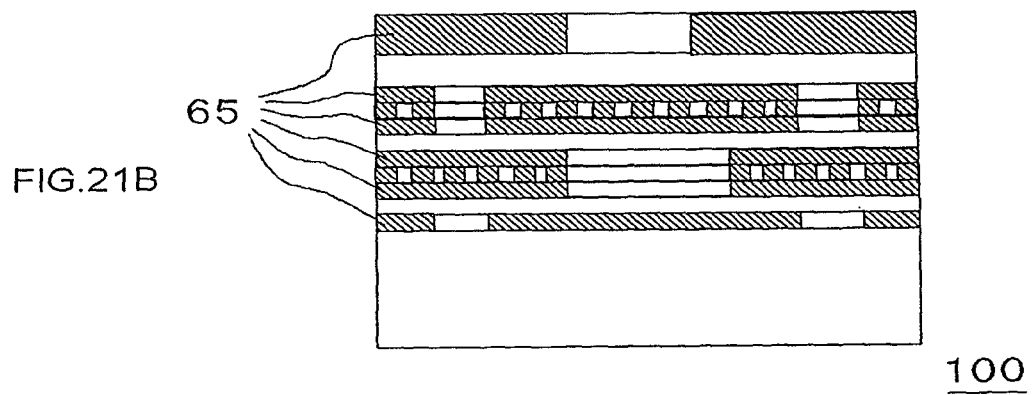
Figure 21C:
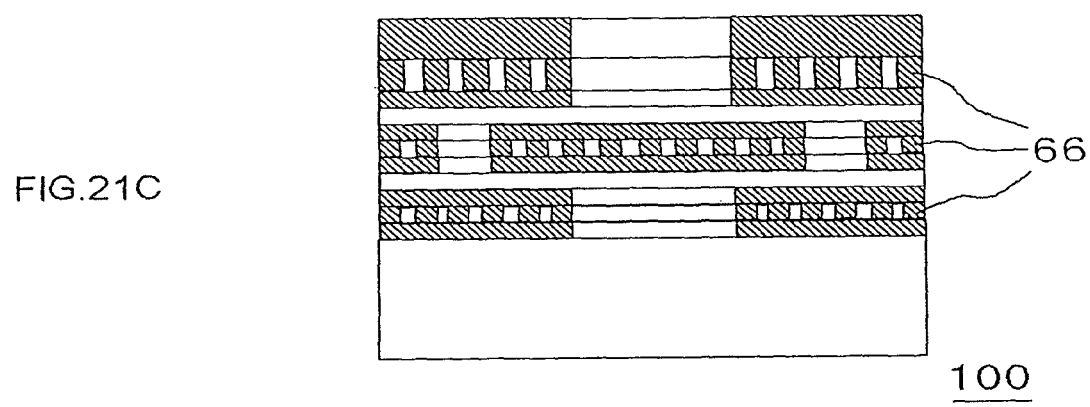

FIGS. 21A to 21C are cross-sectional views each showing a configuration of a semiconductor device 100 according to a present embodiment. In the drawing, description of a surface protective film (polyimide or the like) is not shown. FIG. 21B and FIG. 21C are cross-sectional views of planes A and B of FIG. 21A, respectively.

In the present embodiment, as shown in FIGS. 21A to FIG. 21C, dummy metal structures 30a to 30f are composed of dummy interconnects 65 formed in interconnect layers 63 and dummy vias 66 formed in via layers 64. The dummy interconnects 65 are linearly formed; whereas, the dummy vias 66 are not linearly formed, but the dummy vias are formed in a plug shape (cylindrically) as in usual vias. Due to a problem on a manufacturing process such as photolithography, there is a difficult case to form a linear dummy metal in a via layer; and therefore, only the dummy via can be formed in the usual plug shaped (cylindrical) via.

The embodiments according to the present invention are described above with reference to the drawings; however, these embodiments are exemplifications of the present invention, and various configurations other than the above-mention can be adopted.

The dummy metal block 24 needs to be short in height (length in the laminating direction) to a degree that the impact direction is effectively changed, however, it may be formed by either a single damascene process or a dual damascene process. When the dummy interconnect is formed by the dual damascene process, the dummy interconnect is formed continuously in the interconnect layer and the via layer. Each dummy metal block 24 is arranged so as to pass through one low dielectric constant film, and the upper surface can be arranged so as to come in contact with a low dielectric constant film located at the upper layer. In this regard, however, in the case where it is difficult to put in contact with the upper layer low dielectric constant film for convenience of a manufacturing process or an interconnect film configuration; the same effect can be obtained by putting in contact with a film with poor adhesiveness against the dummy metal block 24 or a film with poor mechanical strength.

In addition, the dummy interconnect may be configured not to be applied to a whole interconnect layer. For example, in a global interconnect layer in which the low dielectric constant film is not used, formation of the dummy interconnect can be omitted.

Sixth Embodiment

A trapezoid-shaped section is shown in Japanese Laid-open Patent Publication No. 2001-21933.

Figure 22:
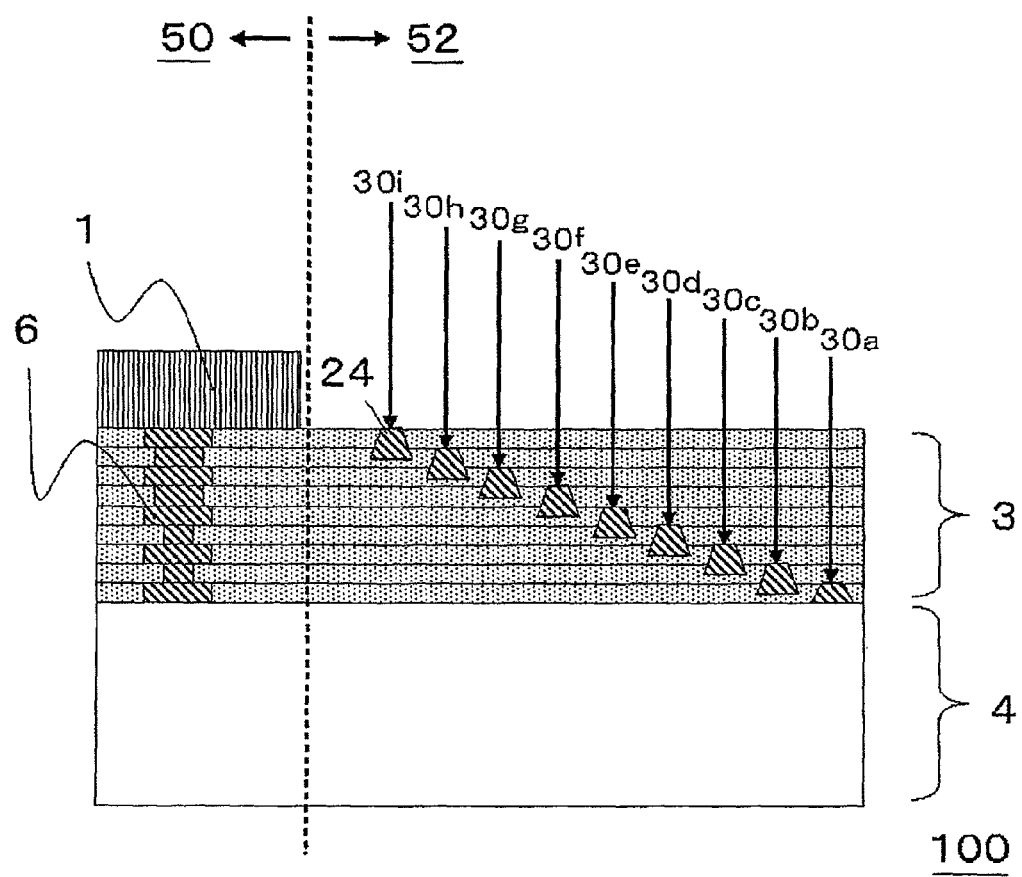
FIG. 22 is a cross-sectional view showing a configuration of a semiconductor device according to an embodiment of the present invention.

FIG. 22 is a cross-sectional view showing a configuration of a semiconductor device 100 according to a present embodiment. According to the present invention, the shape of each of the dummy metal blocks 24 is different from that of the first to fifth embodiment. According to the present invention, each of the dummy metal blocks 24 has a trapezoid-shaped section where the length of the upper side thereof is shorter than that of the lower side.

FIGS. 23A to 25 show cross-sectional views showing the method of manufacturing the semiconductor device 100 of the present embodiment. The dummy metal blocks 24 of the present embodiment are formed in the similar manner as those disclosed in Japanese Laid-open Patent Publication No. 2001-23933.

Figure 23A:
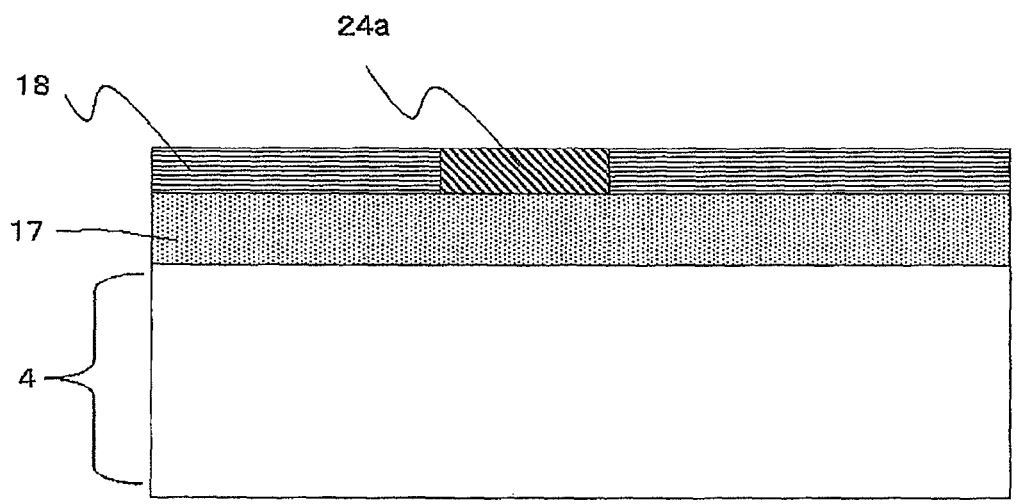
FIGS. 23A to 25 show cross-sectional views showing the method of manufacturing a semiconductor device according to an embodiment of the present invention.

As shown in FIG. 23A, after forming the stopper insulating film 18 on the silicon oxide film 17, a concave portion is formed in the stopper insulating film 18. Then, the concave portion is filled with a Cu layer 24a. Then, the Cu layer 24a outside the concave portion is removed by CMP or the like to have the thickness of the Cu layer 24a equal to that of the stopper insulating film 18.

Figure 23B:
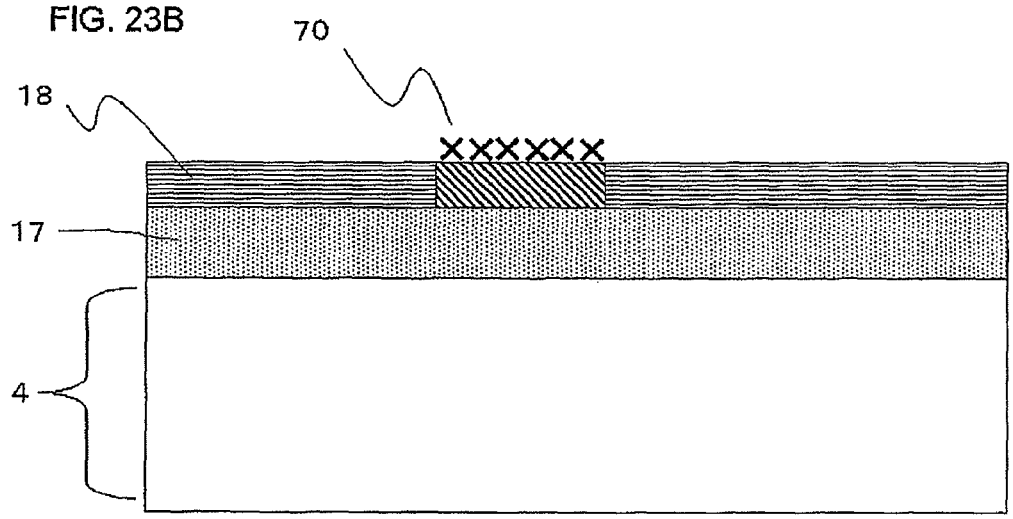
Figure 24A:
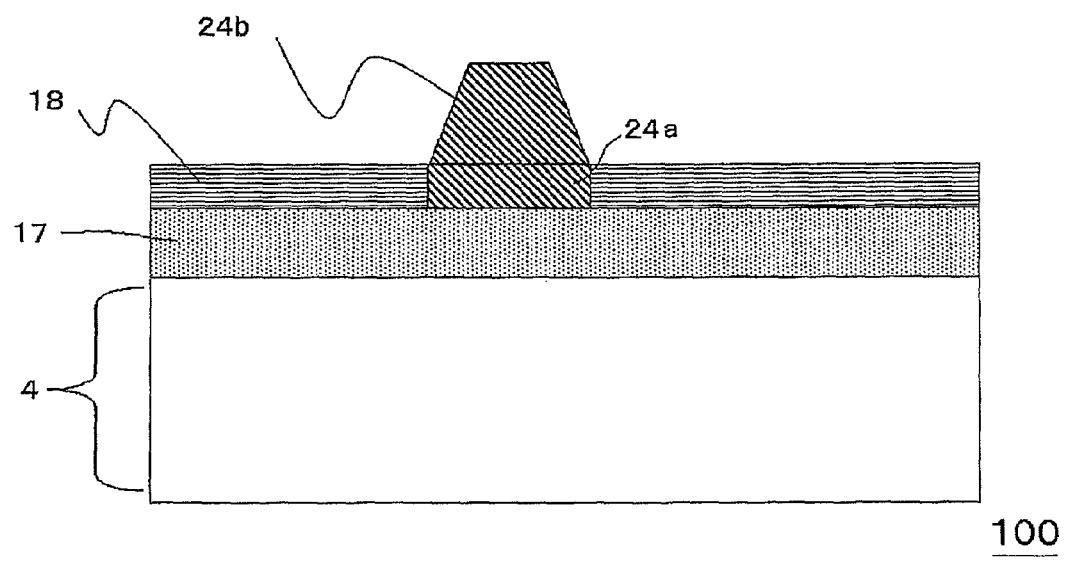
Figure 24B:
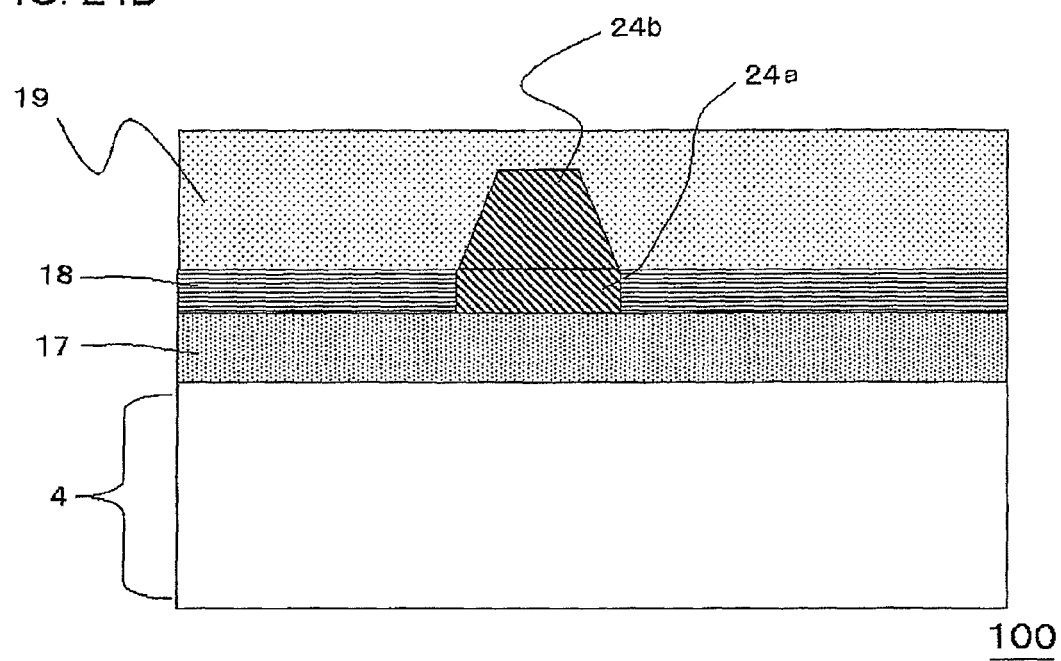
Figure 25:
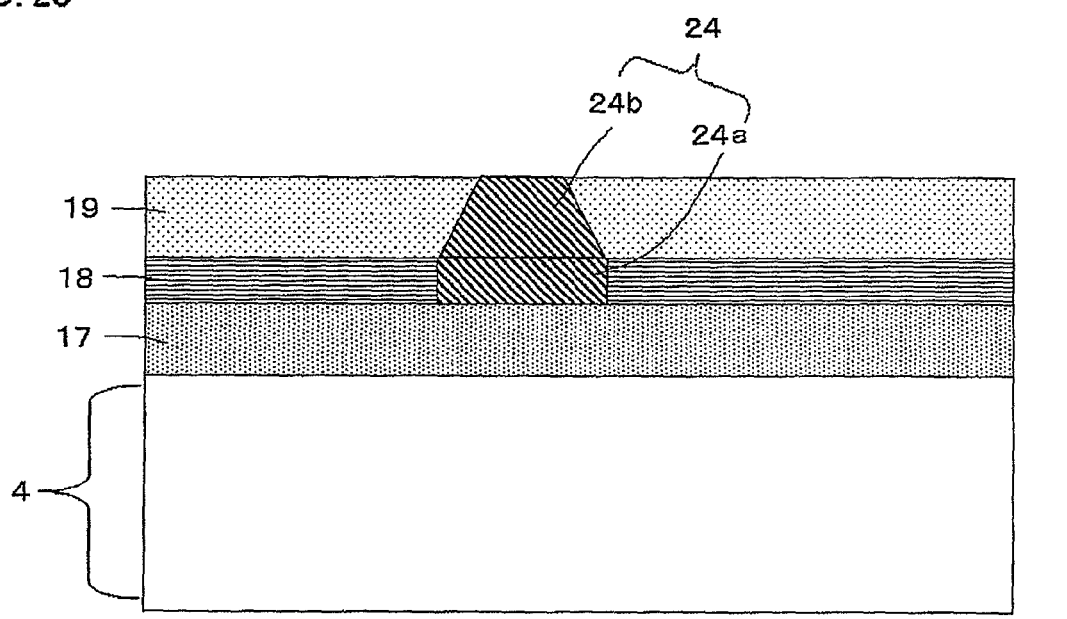

Then, Pd layer is formed on the Cu layer 24a (FIG. 23B). Then, electroless plating is performed with a plating solution including an additive that suppresses the formation of the metals at the edge sides to form a dummy Cu interconnect 24b (FIG. 24A). Then, the low dielectric constant insulating film 19 is formed on the dummy Cu interconnect 24b to cover the entire upper surface of the dummy Cu interconnect 24b (FIG. 24B). Then performing CMP, the upper surface of the dummy Cu interconnect 24b is exposed (FIG. 25).

Though not shown in the drawings, thereafter, the same procedure can be performed to form the dummy Cu interconnect 24b in the protective insulating film 20. Firstly, Pd layer is formed on the upper surface of the dummy Cu interconnect 24b formed in the low dielectric constant insulating film 19. Then, electroless plating is performed with a plating solution including an additive that suppresses the formation of the metals at the edge sides to form another dummy Cu interconnect 24b. Then, the protective insulating film 20 is formed on the newly formed dummy Cu interconnect 24b to cover the entire upper surface thereof. Then performing CMP, the upper surface of the newly formed dummy Cu interconnect 24b is exposed.

With the above steps, the dummy metal blocks 24 of the present embodiment, including the Cu layer 24a and the dummy Cu interconnect 24b is formed.

By repeatedly performing the above steps, the semiconductor device 100 as shown in FIG. 22 can be obtained.

Figure 26:
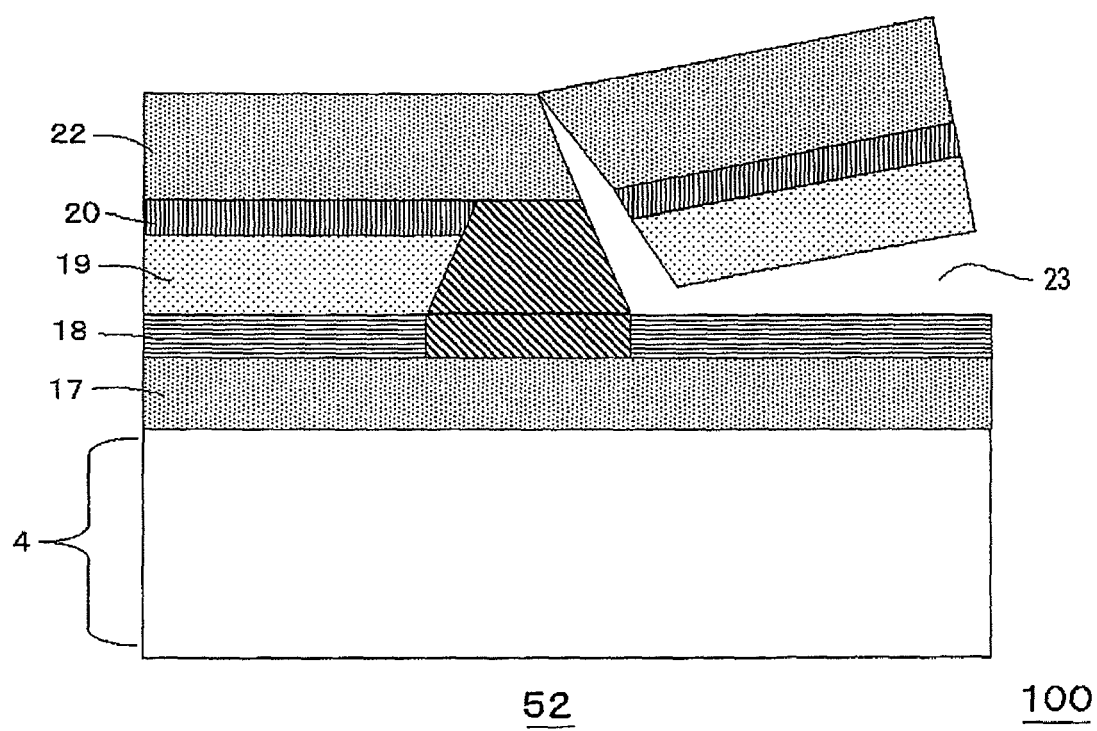
FIG. 26 is a view showing an example in which a separation is generated between a stopper insulating film and a low dielectric constant insulating film.

FIG. 26 is a view showing an example in which separation 23 is generated between the stopper insulating film 18 and the low dielectric constant insulating film 19. By forming the shape of each of the dummy metal blocks 24 in a trapezoid-shaped section, the crack can be formed upwardly.

Seventh Embodiment

Figure 27:
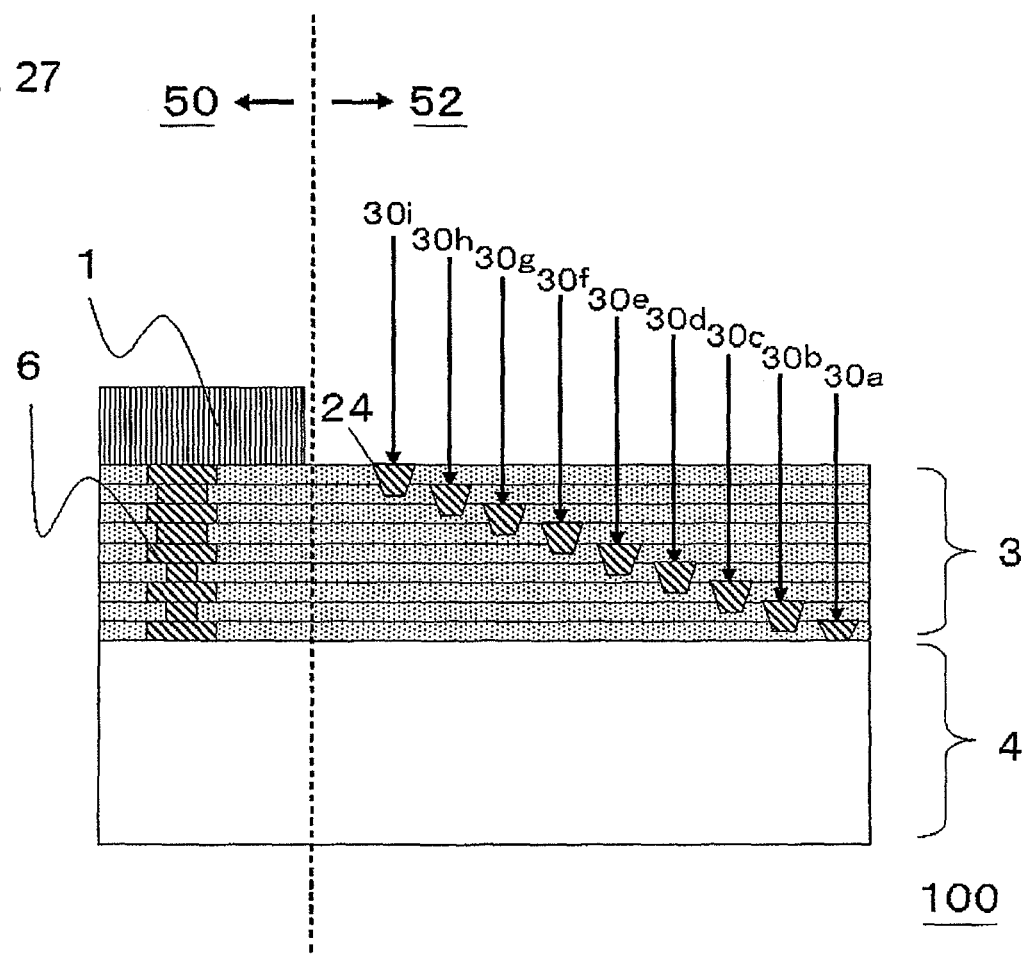
FIG. 27 is a cross-sectional view showing a configuration of a semiconductor device according to an embodiment of the present invention.

FIG. 27 is a cross-sectional view showing a configuration of a semiconductor device 100 according to a present embodiment. According to the present invention, the shape of each of the dummy metal blocks 24 is different from that of the first to fifth embodiment. According to the present invention, each of the dummy metal blocks 24 has a trapezoid-shaped section where the length of the upper side thereof is longer than that of the lower side.

FIGS. 28A to 30B show cross-sectional views showing the method of manufacturing the semiconductor device 100 of the 20present embodiment.

Figure 28A:
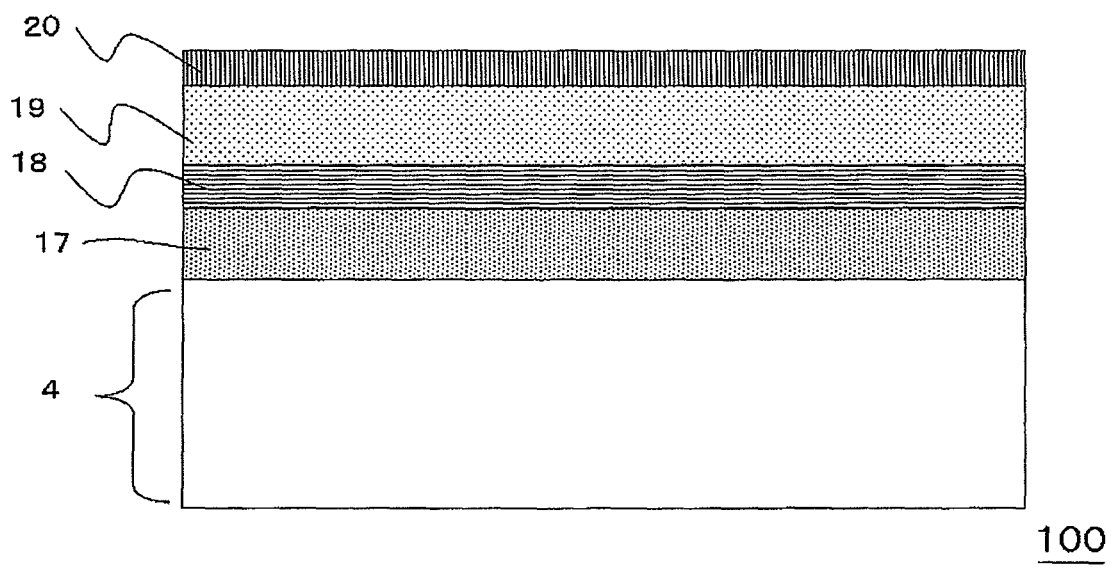
FIGS. 28A to 30B show cross-sectional views showing a method of manufacturing a semiconductor device according to an embodiment of the present invention.
Figure 28B:
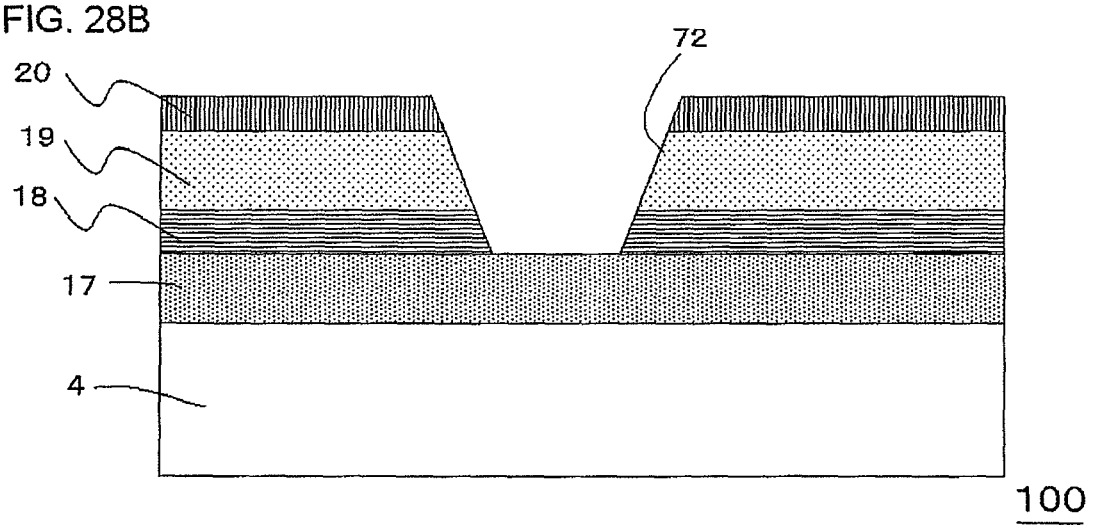

As shown in FIG. 28A, the silicon oxide film 17, the stopper insulating film 18, the low dielectric constant insulating film 19, and the protective insulating film 20 are formed on the silicon layer 4 in this order. Then, a concave portion 72 having a trapezoid-shaped section where the length of the upper side thereof is longer than that of the lower side is formed in the protective insulating film 20, the low dielectric constant insulating film 19, and the stopper insulating film 18 by etching (FIG. 28B). Then, a Cu seed layer 24c is formed on the entire surface, by for example a sputtering (29A).

Figure 29A:
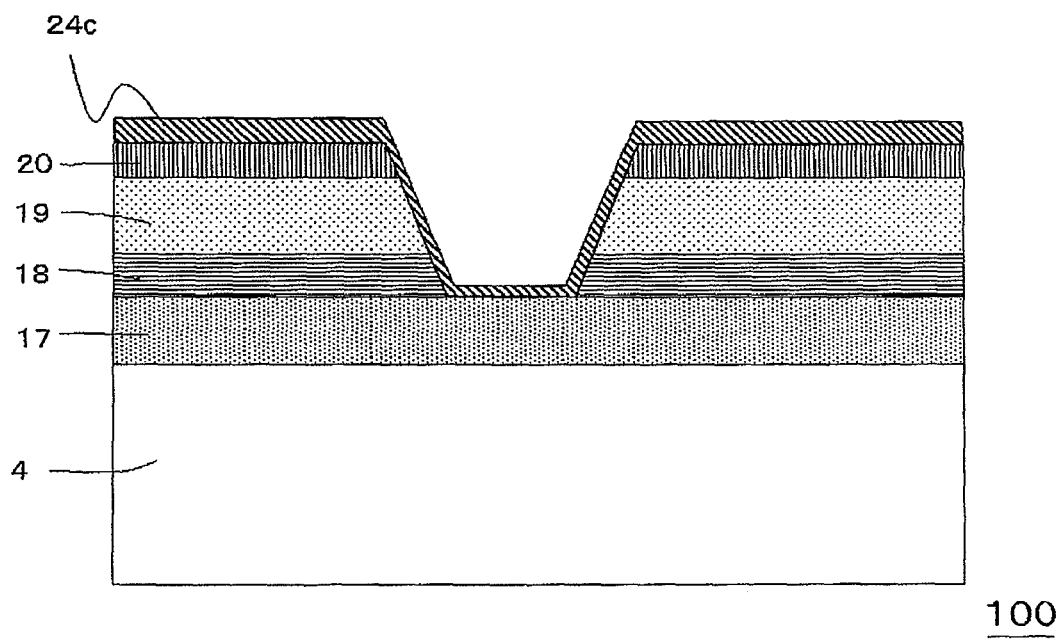
Figure 29B:
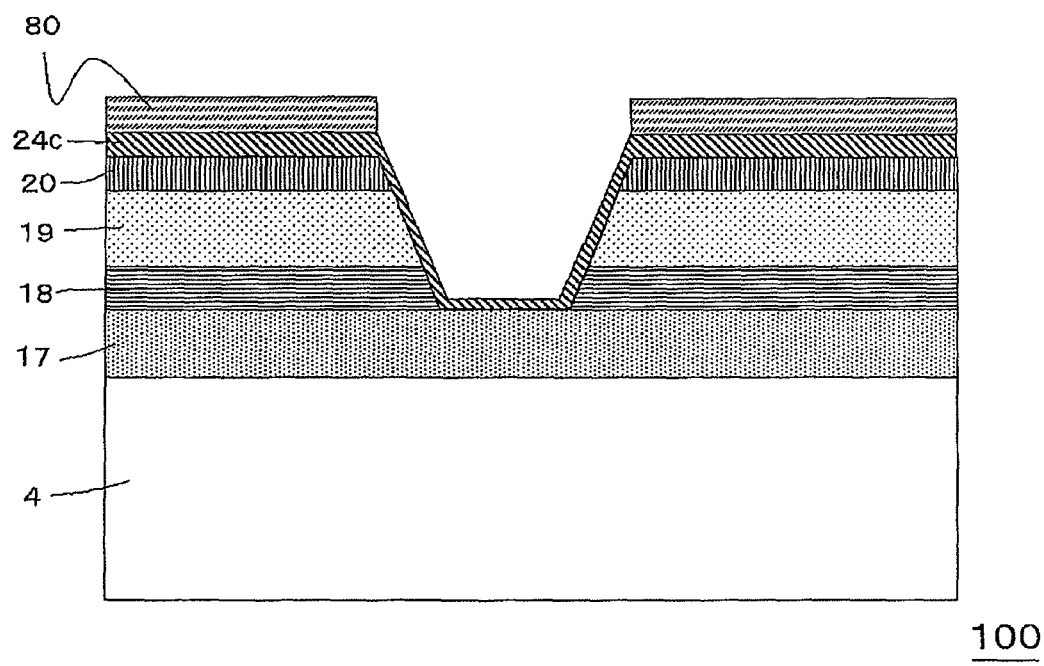
Figure 30A:
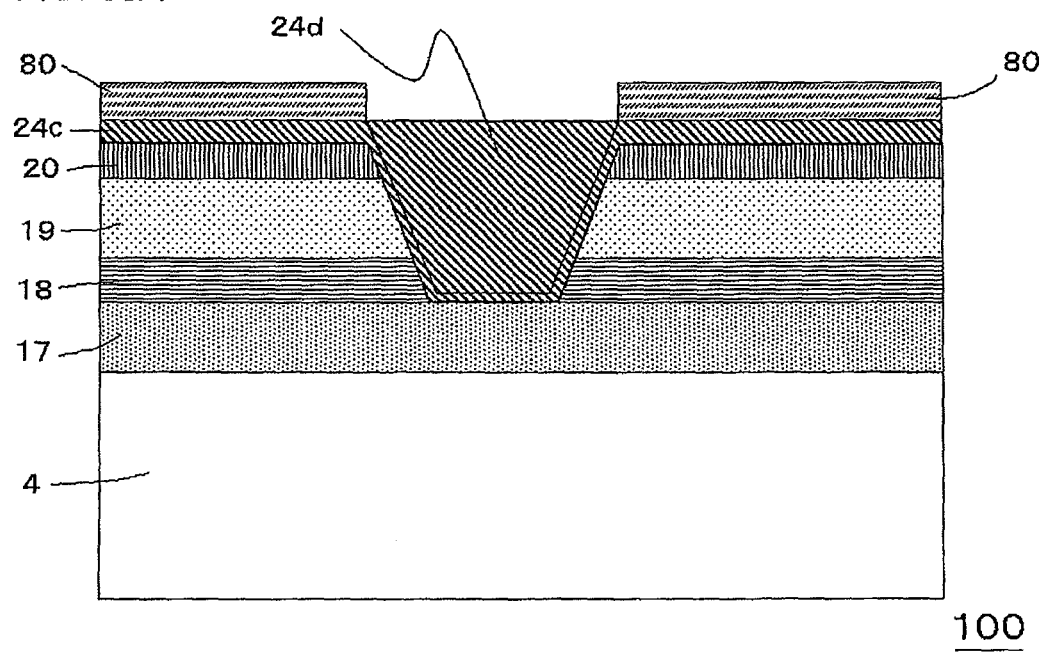
Figure 30B:
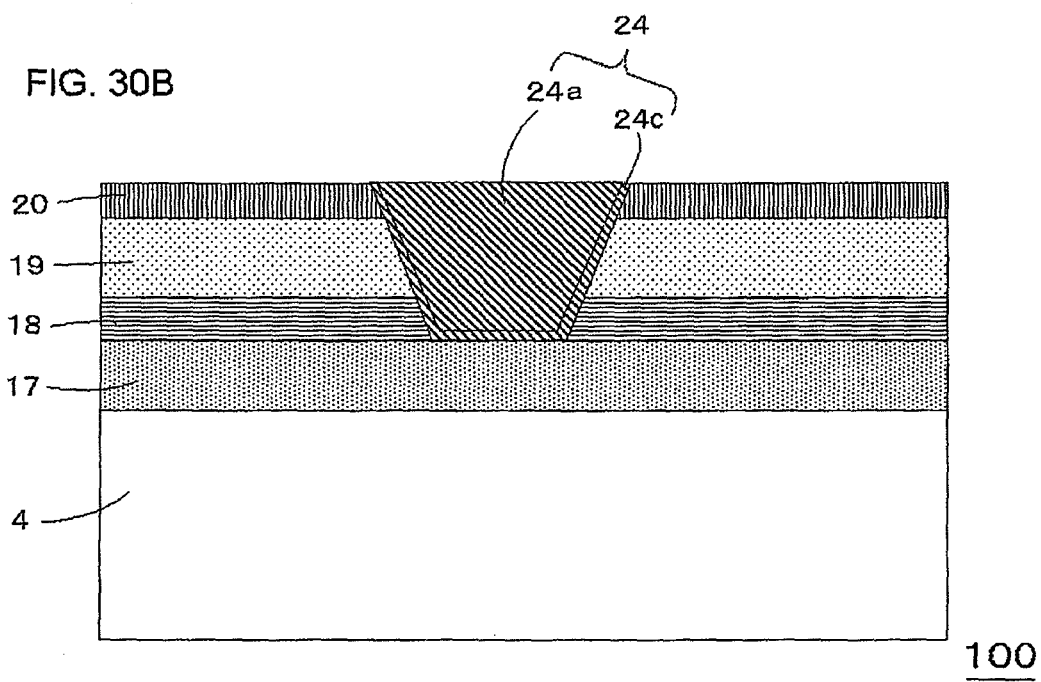

Then, photo resist 80 is formed outside the concave portion (FIG. 29B). Thereafter, the dummy Cu interconnect 24d is formed in the concave portion 70 by electrolytic plating (FIG. 30A). After removing the photo resist 80, the Cu seed layer 24c and the dummy Cu interconnect 24d outside the concave portion 70 is removed by CMP or the like (FIG. 30B). With the above steps, the dummy metal blocks 24 of the present embodiment, including Cu seed layer 24c and the dummy Cu interconnect 24d is formed.

By repeatedly performing the above steps, the semiconductor device 100 as shown in FIG. 27 can be obtained.

Figure 31:
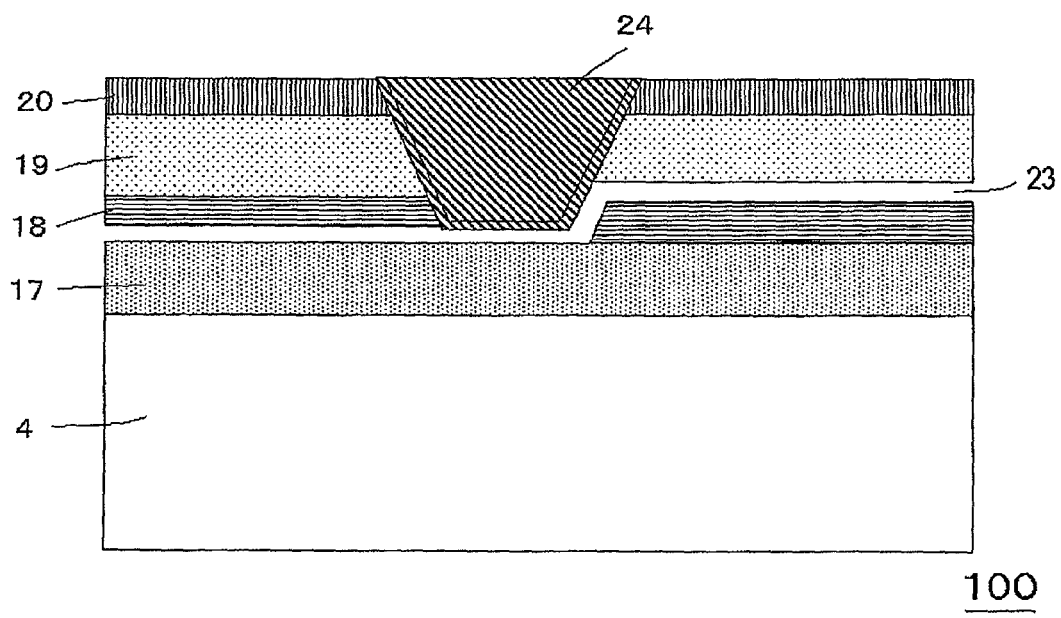
FIG. 31 is a view showing an example in which a separation is generated between a stopper insulating film and a low dielectric constant insulating film.

FIG. 31 is a view showing an example in which separation 23 is generated between the stopper insulating film 18 and the low dielectric constant insulating film 19.

It is apparent that the present invention is not limited to the above embodiments, and may be modified and changed without departing from the scope and spirit of the invention.

What is claimed is:

1. A semiconductor device comprising:
   a semiconductor substrate;
   a multilayer interconnect structure having a first insulating film and a second insulating film formed in this order on said semiconductor substrate, and interconnects respectively formed in said first insulating film and said second insulating film;
   a seal ring formed on an outer circumference of an element forming region when seen from the top in said multilayer interconnect structure;
   a first dummy metal structure formed in said first insulating layer and formed on an outer circumference of said seal ring when seen from the top;
   a second dummy metal structure formed in said second insulating layer and formed between said first dummy metal structure and said seal ring when seen from the top;
   wherein said first dummy metal structure and said second dummy metal structure are arranged adjacent to each other and not to overlap when seen from the top;
   the upper surface of said first dummy metal structure is arranged at a level equal to or higher than the level of the lower surface of said second dummy metal structure; and
   wherein the each of the first and second dummy metal structures has a trapezoid-shaped section where the length of the upper side thereof is shorter than that of the lower side or the length of the upper side thereof is longer than that of the lower side.

2. The semiconductor device according to claim 1,
   wherein said first dummy metal structure and said second dummy metal structure are formed in the vicinity of the corners of said element forming region when seen from the top.

3. The semiconductor device according to claim 1,
   further comprising a structure composed of a metal material formed on said second dummy metal structure, said metal material having a hardness or coefficient of elasticity lower than that of a material which constitutes said dummy metal structure.

4. The semiconductor device according to claim 1,
   wherein said first dummy metal structure and said second dummy metal structure are respectively made up of a dummy interconnect and a dummy via, respectively; and said dummy via is formed in a plug shape.

5. The semiconductor device according to claim 1,
   wherein each of said first dummy metal structure and said second dummy metal structure is formed to pass through one of said interconnect layer but is not continuously formed not to pass through two of said interconnect layers which are continuously arranged.

6. The semiconductor device according to claim 1, wherein said first dummy metal structure is made up of a plurality of dummy metal blocks having an arrangement where a region formed with said dummy metal block and a region without said first dummy metal block are alternately provided in a laminated direction of said multilayer interconnect structure, and said second dummy metal structure is made up of a plurality of dummy metal blocks having an arrangement where a region formed with said dummy metal block and a region without said dummy metal block are alternately provided in the laminated direction of said multilayer interconnect structure.

7. The semiconductor device according to claim 6,
   wherein said plurality of said dummy metal blocks of said first dummy metal structure and said second dummy metal structure are alternatively arranged in the laminated direction of said multilayer interconnect structure such that said dummy metal block of said first dummy metal structure is formed at the same level as said region without said dummy metal block of said second dummy metal structure, and said dummy metal block of said second dummy metal structure is formed at the same level as said region without said dummy metal block of said first dummy metal structure.

8. The semiconductor device according to claim 1,
   wherein the upper surface of said second dummy metal structure is arranged at a level equal to or higher than the level of the upper surface of the uppermost layer of said multilayer interconnect structure.

* * * * *